(12) United States Patent
Ishii

(10) Patent No.: US 10,832,788 B2
(45) Date of Patent: Nov. 10, 2020

(54) SEMICONDUCTOR DEVICE

(71) Applicant: RENESAS ELECTRONICS CORPORATION, Tokyo (JP)

(72) Inventor: Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/682,931

(22) Filed: Nov. 13, 2019

(65) Prior Publication Data

US 2020/0202968 A1 Jun. 25, 2020

(30) Foreign Application Priority Data

Dec. 19, 2018 (JP) .................................. 2018-237425

(51) Int. Cl.
*G11C 29/14* (2006.01)
*G11C 11/419* (2006.01)
*G11C 29/12* (2006.01)
*G11C 11/417* (2006.01)

(52) U.S. Cl.
CPC ............ *G11C 29/14* (2013.01); *G11C 11/417* (2013.01); *G11C 11/419* (2013.01); *G11C 29/1201* (2013.01); *G11C 29/12015* (2013.01)

(58) Field of Classification Search
CPC ....... G11C 29/14; G11C 29/006; G11C 29/04; G11C 11/417
See application file for complete search history.

(56) References Cited

U.S. PATENT DOCUMENTS

| 5,761,215 A | 6/1998 | McCarthy et al. | |
| 5,933,379 A * | 8/1999 | Park | G11C 29/56 365/189.02 |
| 7,551,499 B2 * | 6/2009 | Lee | G11C 7/222 365/189.05 |

FOREIGN PATENT DOCUMENTS

JP 11-231028 A 8/1999

* cited by examiner

*Primary Examiner* — Han Yang
(74) *Attorney, Agent, or Firm* — McDermott Will & Emery LLP

(57) ABSTRACT

A semiconductor device has a memory circuit and a logic circuit coupled with a memory circuit. the memory circuit included a memory array in which memory cells are arranged in a matrix, an input/output circuit for writing data to the memory cells and reading data from the memory cells, and a control circuit for generating a control signal for controlling the input/output circuit. In a test operation for testing the logic circuit, the input/output circuit receives a test data. The control circuit raises and lowers the control signal based on a rising and a falling of an external clock signal, thereby the test data is output to the logic circuit via the input/output circuit.

20 Claims, 9 Drawing Sheets

SEMICONDUCTOR DEVICE

CROSS-REFERENCE TO RELATED APPLICATIONS

The disclosure of Japanese Patent Application No. 2018-237425 filed on Dec. 19, 2018 including the specification, drawings and abstract is incorporated herein by reference in its entirety.

BACKGROUND

The present application relates to a semiconductor device. For example, the semiconductor device includes a memory circuit and a logic circuit to be tested.

Conventionally, DFT (Design For Testability) techniques have been used to shorten a testing time of the semiconductor device. The semiconductor device is called a SOC (System On a Chip) in which a memory circuit, a plurality of logic circuits and a plurality of flip-flops are formed. One of the DFT techniques is a scan path test. An object of the scan path test is the logic circuits in the semiconductor device.

In the scan path test, the flip-flops in the semiconductor device are coupled in series for operating as a shift register, thereby the plurality of logic circuits are tested. By performing the scan path test, a defect in the logic circuit is identified. After a defective part is specified, the cause of the defect is analyzed, and a countermeasure is reflected in a circuit design and a manufacturing process. Therefore, a reliability of the semiconductor device is improved.

In addition, when the scan path test is performed, the memory circuit may be arranged in a front stage of the logic circuit of the test object. Since the memory circuit is outside the test object, a test data for the scan path test is outputted to the logic circuit arranged in a rear stage of the memory circuit by bypassing the memory circuit.

Japanese unexamined Patent Application publication No. H11-231028 (Patent Document 1) discloses a test method for a semiconductor device in which a combinational logic and a memory are formed. The Patent Document 1 discloses a technique in which a test data is transferred from a write data register to an output latch/driver by bypassing a write data driver, a memory cell and a sense amplifier. Moreover, as another test method, the Patent Document 1 discloses a technique in which a scan bypass data is transferred to a read data driver by bypassing a memory array.

SUMMARY

However, the semiconductor device described in the Patent Document 1 is provided with a dedicated write data bypass circuit or a dedicated scan bypass enable logic circuit for bypassing the memory array or the memory cell. Therefore, there is room for improvement from a viewpoint of miniaturization of the semiconductor device. Other objects and novel features will become apparent from the description of this specification and the accompanying drawings.

A semiconductor device according to one embodiment includes a memory circuit. The memory circuit includes a memory array including a plurality of memory cells arranged in a matrix, an input/output circuit for writing data to the plurality of memory cells and reading data from the plurality of memory cells, and a control circuit for generating a control signal for controlling the input/output circuit. The semiconductor device further includes a logic circuit coupled with the memory circuit. In a test operation for testing the logic circuit, the control circuit receives an external clock signal, raises and lowers the control signal based on a rising and falling of the external clock signal. the input/output circuit receives a test data. The test data is output to the logic circuit via the input/output circuit based on the control circuit.

A semiconductor device according to one embodiment includes a memory circuit. The memory circuit includes a memory array including a plurality of memory cells arranged in a matrix, a plurality of input/output circuits for writing data to the plurality of memory cells and reading data from the plurality of memory cells, and a control circuit for generating a control signal for controlling the plurality of input/output circuits. The semiconductor device further includes a plurality of logic circuits coupled with the plurality of input/output circuits. In a test operation for testing the plurality of logic circuits, the control circuit receives an external clock signal, raises and lowers the control signal based on a rising and falling of the external clock signal. Each of the plurality of input/output circuits receives a test data. The test data is output to each of the plurality of logic circuits via each of the plurality of input/output circuits based on the control signal.

A semiconductor device according to one embodiment includes a memory circuit. The memory circuit includes a memory array including a plurality of memory cells arranged in a matrix, a input/output circuits for writing data to the plurality of memory cells and reading data from the plurality of memory cells, and a control circuit for generating a control signal for controlling the plurality of input/output circuits. The semiconductor device further includes a logic circuits coupled with the input/output circuits. In a test operation for testing the logic circuit, the control circuit receives an external clock signal and generates a control signal synchronized with a pulse width of the external clock signal. The input/output circuit receives a test data. The test data is output to the logic circuit via the input/output circuit based on the control circuit.

According to one embodiment, the semiconductor device including the memory circuit and the logic circuit which is a test object can be miniaturized.

DETAILED DESCRIPTION

In the following embodiments, when required for convenience, the description will be made by dividing into a plurality of sections or embodiments, but except when specifically stated, they are not independent of each other, and one is related to the modified example, some or all of the other, applications, detailed description, supplementary description, and the like.

In the following embodiments, the number of elements, including the number of constituent elements, numerical values, quantities, ranges etc., is not limited to the specific number, but may be not less than or equal to the specific number, except for cases where the number is specifically indicated and is clearly limited to the specific number in principle.

Furthermore, in the following embodiments, the constituent elements (including the operation steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially similar to the shapes and the like, except for the case in which they are specifically specified and the case in which they are considered to be obvious in principle, and the like.

Further, in the following embodiments, a "H" level of a signal indicates a High level of a voltage. For example, the "H" level of the signal is a power supply voltage level. On the other hand, a "L" level of the signal indicates a low level of the voltage. For example, the "L" level of the signal is a ground voltage level.

Further, in the following embodiments, an "activation" of the signal indicates that the signal transitions from an initial state level to a different level. For example, the signal transitions from the "L" level to the "H" level (a rising of the signal). On the other hand, a "deactivation" of the signal indicates the signal transitions from the above-mentioned different level to the initial state level. For example, the signal transitions from the "H" level to the "L" level (a falling of the signal).

First Embodiment

Configuration of Semiconductor Device

Figure 1:
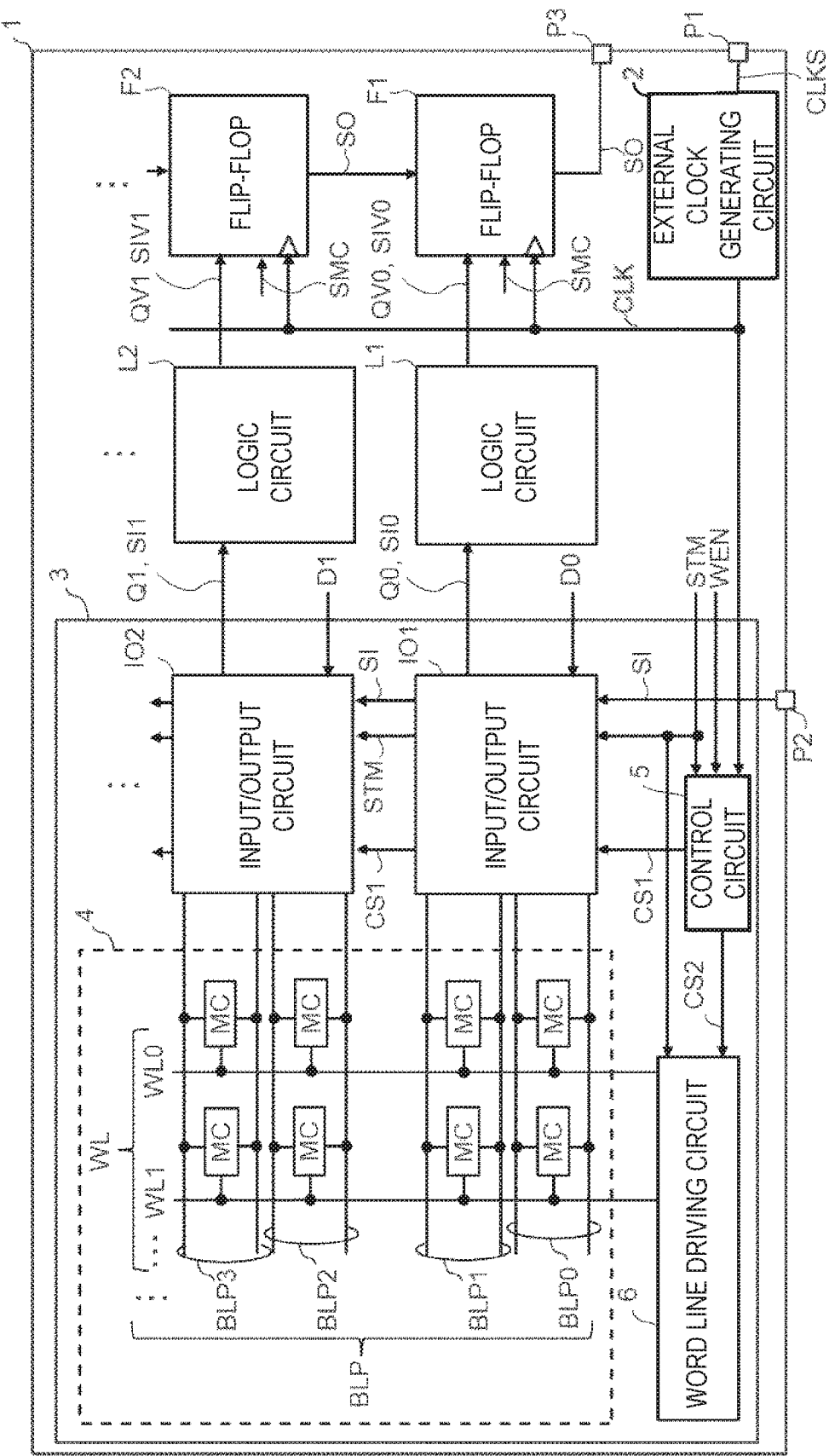
FIG. 1 is a block diagram illustrating a configuration example of a semiconductor device.

FIG. 1 is a block diagram illustrating a configuration example of a semiconductor device.

A semiconductor device 1 includes an external clock generation circuit 2, a memory circuit 3, a plurality of logic circuits L1 and L2, a plurality of flip-flops F1 and F2, a clock source terminal P1, a scan-in terminal P2, and a scan-out terminal P3. In FIG. 1, two logic circuits L1 and L2 and two flip-flops F1 and F2 are provided, but the number is not limited thereto.

A power supply voltage and a ground voltage are supplied from a power supply terminal and a ground terminal (not shown) to the external clock generation circuit 2, the memory circuit 3, the plurality of logic circuits L1 and L2, and the plurality of flip-flops F1 and F2 in the semiconductor device 1 as operation voltages. For example, the power supply voltage is 3.3 V and the ground voltage is 0 V.

The external clock generation circuit 2 is coupled with the memory circuit 3, the plurality of flip-flops F1 and F2, and the clock source terminal P1.

The external clock generation circuit 2 receives a clock source signal CLKS from an oscillator (not shown) outside the semiconductor device 1 via the clock source terminal P1. The external clock generation circuit 2 generates an external clock signal CLK based on the clock source signal CLKS and supplies the external clock signal CLK to the memory circuit 3 and the plurality of flip-flops F1 and F2. The external clock signal CLK is a signal used to control the operation timings of circuit blocks (e.g., the memory circuit 3 and the plurality of flip-flops F1 and F2) in the semiconductor device 1.

The external clock generation circuit 2 includes a PLL (Phase Locked Loop) circuit and a frequency dividing circuit (not shown) in one example. The PLL circuit receives the clock source signal CLKS and generates a clock signal obtained by multiplying the frequency of the clock source signal CLKS. The PLL circuit outputs the multiplied clock signal to the frequency dividing circuit. The frequency dividing circuit multiplies a frequency of the multiplied clock signal by, e.g., ¼, and outputs the resultant clock signal as the external clock signal CLK. The external clock generation circuit 2 is not limited to the component described above. For example, the external clock generation circuit 2 may include the oscillator described above.

The memory circuit 3 includes a memory array 4, a control circuit 5, a word line driving circuit 6, and a plurality of input/output circuits IO1 and IO2. In FIG. 1, two input/output circuits IO1 and IO2 are provided, but the number is not limited thereto.

The memory array 4 has a plurality of memory cells MC arranged in a matrix. The memory cells MC are rewritable SRAM (Static Random Access Memory) cells. Further, the memory array 4 includes a plurality of word lines WL provided corresponding to rows of the memory cells, and a plurality of bit line pairs BLP provided corresponding to columns of the memory cells, respectively. In FIG. 1, two word lines WL0 and WL1 and four bit line pairs BLP0, BLP1, BLP2 and BLP3 are provided as examples, but the number is not limited thereto.

The control circuit 5 receives a bypass mode signal STM, an internal control signal WEN, and the external clock signal CLK. The control circuit 5 generates a control signal CS1 and a control signal CS2 based on those signals. The control circuit 5 outputs the control signal CS1 to the plurality of input/output circuits IO1 and IO2, and outputs the control signal CS2 to the word line driving circuit 6. Accordingly, the control circuit 5 controls the word line driving circuit 6 and the plurality of input/output circuits IO1 and IO2. As will be described later, the control signals CS1 and CS2 are signals including one or more signals.

The word line driving circuit 6 is coupled with the plurality of word lines WL. The word line driving circuit 6 also receives the control signal CS2 and the bypass mode signal STM and drives the plurality of word lines WL based on those signals.

The input/output circuit IO1 is coupled with the plurality of bit line pairs BLP0 and BLP1. The input/output circuit IO2 is coupled with the plurality of bit line pairs BLP2 and BLP3. In FIG. 1, two input/output circuits IO1 and IO2 are provided as examples, but the number is not limited thereto. In addition, each input/output circuit is coupled with two bit line pairs, but the number is not limited thereto. Here, the input/output circuit IO1 will be described.

In an operation of writing data to the memory cell MC (hereinafter referred to as writing operation), the input/output circuit IO1 receives a data D0 from a logic circuit (not shown) in the semiconductor device 1 based on the bypass mode signal STM. The input/output circuit IO1 writes the data D0 to the memory cell MC via a corresponding bit line pair BLP (e.g., BLP0) based on the control signal CS1.

In an operation of reading a data Q0 from the memory cell MC (hereinafter referred to as reading operation), the input/output circuit IO1 reads the data Q0 held by the memory cell MC via a corresponding bit line pair BLP (for example, BLP_0) based on the control signal CS1. Accordingly, the input/output circuit IO1 outputs the data Q0 to the logic circuit L1.

In a scan path test operation (hereinafter referred to as test operation), the input/output circuit IO1 receives a test data SI via the scan-in terminal P2 based on the bypass mode signal STM. The test data SI is outputted to the logic circuit L1 via the input/output circuit IO1 without via the memory array 4 based on the control signal CS1, as a test data SI0. Therefore, at the time of the test operation, a bypass operation is performed in which the test data SI bypasses the memory array 4 and is output to the logic circuit L1.

Further, in the test operation, the plurality of input/output circuits IO1 and IO2 are serially coupled as a transmission path of the test data SI in accordance with the bypass mode signal STM to form a scan chain. Accordingly, the plurality of input/output circuits IO1 and IO2 function as a shift register based on the control signal CS1. Specifically, the test data SI input to the input/output circuit IO1 is also input to the input/output circuit IO2 in a next stage based on the control signal CS1. Therefore, the plurality of input/output circuits IO1 and IO2 shift the test data SI in the order of the data transmission path based on the control signal CS1.

Although the input/output circuit IO1 has been described above, the input/output circuit IO2 operates in a similar manner. However, the data input to the input/output circuit IO2 is the data D1 at the time of the reading operation. The data output from the input/output circuit IO2 is the data Q1 at the time of the reading operation. The data is the test data SI1 at the time of the test operation.

The logic circuit L1 is coupled with the memory circuit 3 and the flip-flop F1. The logic circuit L2 is coupled with the memory circuit 3 and the flip-flop F2. Here, the logic circuit L1 will be described.

The logic circuit L1 receives a data from the input/output circuit IO1 of the memory circuit 3. The data is the data Q0 in the reading operation and is the test data SI0 in the test operation.

The logic circuit L1 performs a required processing on the data, and outputs the processing result data to the flip-flop F1. The processing result data is a data QV0 at the time of the reading operation and is a test data SIV0 at the time of the test operation. At the time of the test operation, the logic circuit L1 is test object.

Although the logic circuit L1 has been described above, the logic circuit L2 operates in a similar manner. However, a data input to the logic circuit L2 is the data Q1 in the reading operation and is the test data SI1 in the test operation. A data output from the logic circuit L2 is a data QV1 in the reading operation and is a test data SIV1 in the test operation.

The flip-flop F1 is coupled with the logic circuit L1 and the external clock generation circuit 2. The flip-flop F2 is coupled with the logic circuit L2 and the external clock generation circuit 2. Here, the flip-flop F1 will be described.

The flip-flop F1 holds the data input from the logic circuit L1 based on a rising of the external clock signal CLK. The data is the data QV0 in the reading operation and is the test data SIV0 in the test operation. At this time, the scan mode signal SMC is set to "L" level. Although the flip-flop F1 has been described above, the flip-flop F2 operates in a similar manner. However, the data is the data QV1 in the reading operation and is the test data SIV1 in the test operation.

In the test operation, the plurality of flip-flops F1 and F2 output the test data SIV0 and the test data SIV1 held by the flip-flops F1 and F2 as test result signals SO in accordance with the scan mode signal SMC of the "H" level, respectively. At this time, the plurality of flip-flops F1 and F2 are serially coupled as a transmission path of the test result signal SO to form the scan chain. Accordingly, the plurality of flip-flops F1 and F2 operate as a shift register based on the rising of the external clock signal CLK. More specifically, the test data SIV0 held by the flip-flop F1 is outputted from the flip-flop F1 to the scan-out terminal P3 as the test result signal SO, based on the rising of the external clock signal CLK. Similarly, the test data SIV1 held by the flip-flop F2 is outputted from the flip-flop F2 to the flip-flop F1 as the test result signal SO. Therefore, the plurality of flip-flops F1 and F2 shift the test data result signals SO in the order of the data transfer path, based on the rising of the external clock signal CLK. In addition, although the scan mode signal SMC is used in the above description, the bypass mode signal STM may be used instead of the scan mode signal SMC.

A test device (not shown) external to the semiconductor device 1 receives the test result signal SO output from the semiconductor device 1. Accordingly, the test device compares the test result signal SO with an expectation value to determine whether or not the plurality of logic circuits L1 and L2 are defective. After the defective part is specified, the cause of the defect is analyzed, and the countermeasure is reflected in the circuit design and the manufacturing process. Therefore, a reliability of the semiconductor device is improved.

Configuration of Logic Circuit

Figure 2:
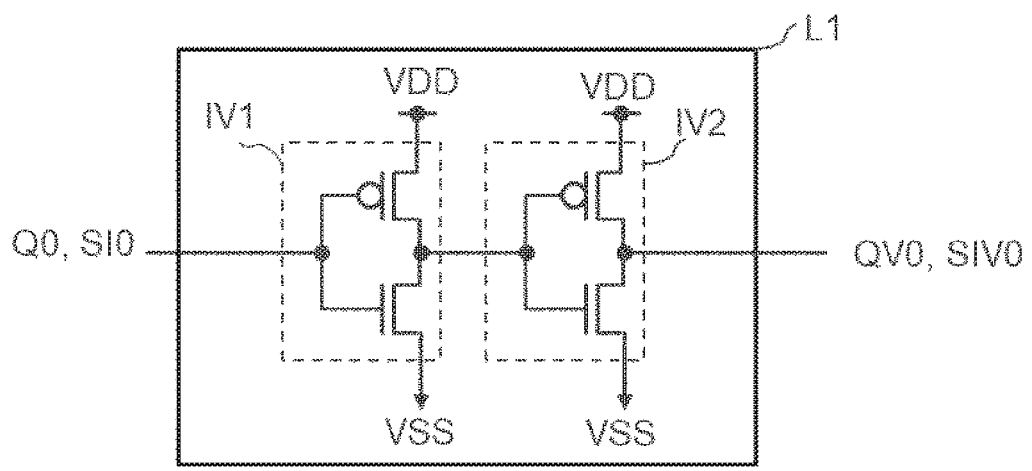
FIG. 2 is a schematic diagram illustrating a configuration example of a logic circuit.

FIG. 2 is a schematic diagram illustrating a configuration example of a logic circuit. As an example, FIG. 2 shows a configuration example of the logic circuit L1.

The logic circuit L1 includes CMOS inverters IV1 and IV2 comprised of a P-channel MOS transistor and an N-channel MOS transistor. The CMOS inverter IV1 and the CMOS inverter IV2 are serially coupled, and an output terminal of the CMOS inverter IV1 is coupled to an input terminal of the CMOS inverter IV2. Specifically, the data Q0 or the test data SI0 is input to an input terminal of the CMOS inverter IV1 in the logic circuit L1. The data QV0 or the test data SIV0 obtained by performing the required processing is output from an output terminal of the CMOS inverter IV2 via the output terminal of the CMOS inverter IV1 and the input terminal of the CMOS inverter IV2.

Although the logic circuit L1 shown in FIG. 2 is configured by the CMOS inverters IV1 and IV2, the logic circuit L1 is not limited to this configuration. For example, the logic circuit L1 may include at least one of logic gates such as a AND circuit, a NAND circuit, a NOR circuit, and a OR circuit. In other words, the logic circuit L1 may be a circuit comprised of at least MOS transistor. Although the logic circuit L1 has been described above, a configuration of the logic circuit L2 is also similar to that of the logic circuit L1.

Configuration of Memory Circuit

Figure 3:
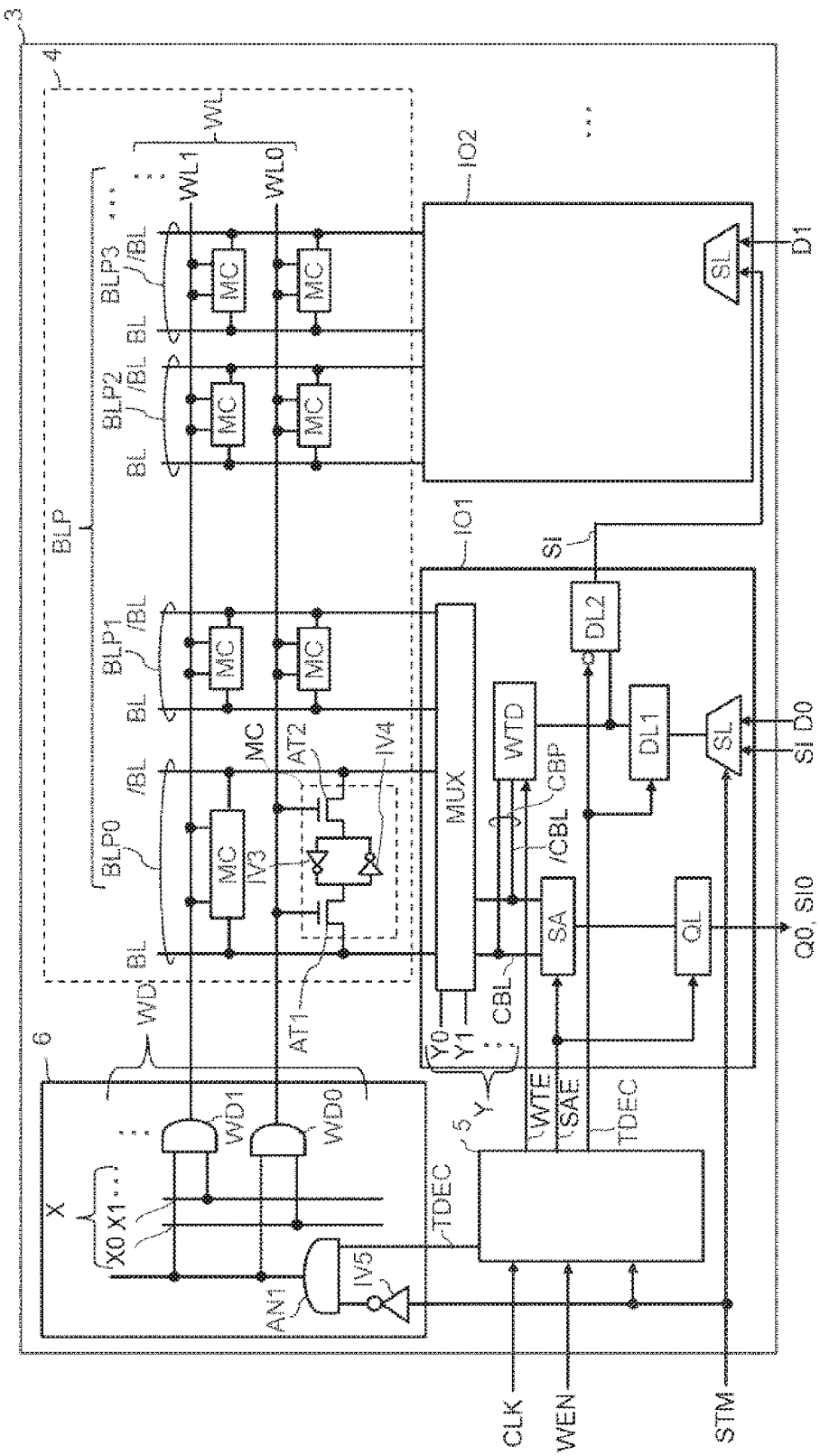
FIG. 3 is a schematic diagram illustrating a configuration example of a memory circuit.

FIG. 3 is a schematic diagram illustrating a configuration example of a memory circuit.

The memory circuit 3 includes the memory array 4, the control circuit 5, the word line driving circuit 6, and the plurality of input/output circuits IO1 and IO2, as described above.

The memory array 4 includes the plurality of memory cells MC, the plurality of word lines WL, and the plurality of bit line pairs BLP, as described above. The bit line pair BLP include bit lines BL and/BL.

The memory cell MC includes six transistors comprised of a plurality of access transistors AT1 and AT2 and a plurality of CMOS inverters IV3 and IV4. the plurality of access transistors AT1 and AT2 are coupled with the word line WL0 and the bit line pair BLP0. The memory cell MC shown in FIG. 3 includes six transistors, but is not limited to thereto. For example, if the ports used in the reading operation and the writing operation are different, the memory cell MC may consist of eight transistors.

The control circuit 5 generates a start-up signal TDEC based on the bypass mode signal STM and the external clock signal CLK, and outputs the start-up signal TDEC to an AND circuit AN1 of the word line driving circuit 6. Incidentally, the control signal CS2 shown in FIG. 1 is the start-up signal TDEC.

The control circuit 5 also generates a write control signal WTE, a read control signal SAE, and the start-up signal TDEC based on the bypass mode signal STM, the external clock signal CLK, and the internal control signal WEN, and outputs these signals to the plurality of input/output circuits IO1 and IO2.

Specifically, the control circuit 5 outputs the write control signal WTE to a write driving circuit WTD. The control circuit 5 outputs the read control signal SAE to a read driving circuit SA and an output latch QL. The control circuit 5 outputs the start-up signal TDEC to an input latch DL1 and an input latch DL2. In FIG. 3, the write control signal WTE, the read control signal SAE and the start-up signal TDEC are output to the circuits in the input/output circuit IO1, but the signals are also output to the circuits in the input/output circuit IO2. Incidentally, the control signal CS1 shown in FIG. 1 includes the write control signal WTE, the read control signal SAE, and the start-up signal TDEC.

The word line driving circuit 6 includes the AND circuit AN1 and a plurality of word drivers WD and an inverter IV5. The word line driving circuit 6 receives the start-up signal TDEC and the bypass mode signal STM and controls the plurality of word driver WD by the AND circuit AN1 and the inverter IV5. Accordingly, a corresponding word driver WD is driven in accordance with a row selection control signal X indicating address information, and the word line WL coupled with the corresponding word driver WD is driven (activated). A word driver WD0 is coupled to the word line WL0, and a word driver WD1 is coupled with the word line WL1. In FIG. 3, two word drivers WD0 and WD1 are provided as examples, but the number is not limited thereto. Similarly, although two row selection control signals X0 and X1 are provided as examples, the number is not limited thereto.

The input/output circuit IO1 includes a selector SL, the input latches DL1 and DL2, the write driving circuit WTD, data line pair CBP, a multiplexer MUX, the read driving circuit SA, and the output latch QL.

The selector SL selects either the data D0 or the test data SI based on the bypass mode signal STM, and outputs the selected data to the input latch DL1.

The input latch DL1 holds the selected data and outputs the selected data to the write driving circuit WTD and the input latch DL2, based on the start-up signal TDEC. The input latch DL1 holds the selected data while the start-up signal TDEC is at the "H" level, and transfers the selected data while the start-up signal TDEC is at the "L" level.

The input latch DL2 holds the data input from the input latch DL1 and outputs the data as test data SI to the selector SL of the input/output circuit IO2 in a subsequent stage, based on the start-up signal TDEC. Further, a signal obtained by inverting the start-up signal TDEC is input to the input latch DL2. The input latch DL2 transfers the data while the start-up signal TDEC is at the "H" level, and holds the data while the start-up signal TDEC is at the "L" level.

Thus, the input latches DL1 and DL2 of the input/output circuit IO1 operate as flip-flop. The input/output circuit IO1 is serially coupled with a selector SL of the input/output circuit IO2 in the next stage via the selector SL and the input latches DL1 and DL2, as the data transfer path of the test data SI. Thereby, the plurality of input/output circuits IO1 and IO2 constitute the scan chain.

The write driving circuit WTD outputs the data input from the input latch DL1 to the data line pair CBP based on the write control signal WTE. Specifically, the write driving circuit WTD is driven (activated) based on the write control signal WTE. The write driving circuit WTD drives (activates) the data line pair CBP in accordance with the data input from the input latch DL1. The data line pair CBP includes a data line CBL and a data line /CBL.

The multiplexer MUX selects a corresponding bit line pair BLP in accordance with a column selection control signal Y indicating the address information. The corresponding bit line pair BLP is coupled with the data line pair CBP via the multiplexer MUX. As a result, the write driving circuit WTD outputs the data input from the input latch DL1 to the corresponding bit line pair BLP via the data line pair CBP and the multiplexer MUX. In FIG. 3, two selection control signals Y0 and Y1 are provided as examples, but the number is not limited thereto.

The read driving circuit SA outputs the data input to the data line pair CBP to the output latch QL based on the read control signal SAE. Specifically, the read driving circuit SA is driven (activated) based on the read control signal SAE. As a result, the read driving circuit SA amplifies a potential difference between the data line CBL and /CBL of the data line pair CBP in accordance with the data input to the data line pair CBP, and outputs the resultant data to the output latch QL.

The output latch QL holds the data input from the read driving circuit SA and outputs the data to the logic circuit L1 shown in FIG. 1, based on the read control signal SAE. The data to be outputted form the output latch QL is the data Q0 in the reading operation and is the test data SI0 in the test operation. The output latch QL transfers the data while the start-up signal TDEC is at the "H" level, and holds the data while the start-up signal TDEC is at the "L" level.

Although only the selector SL in the input/output circuit IO2 is shown in FIG. 3, the other circuits in the input/output circuit IO2 are similar to the circuits described above in the input/output circuit IO1.

Configuration of Control Circuit (First Embodiment)

Figure 4:
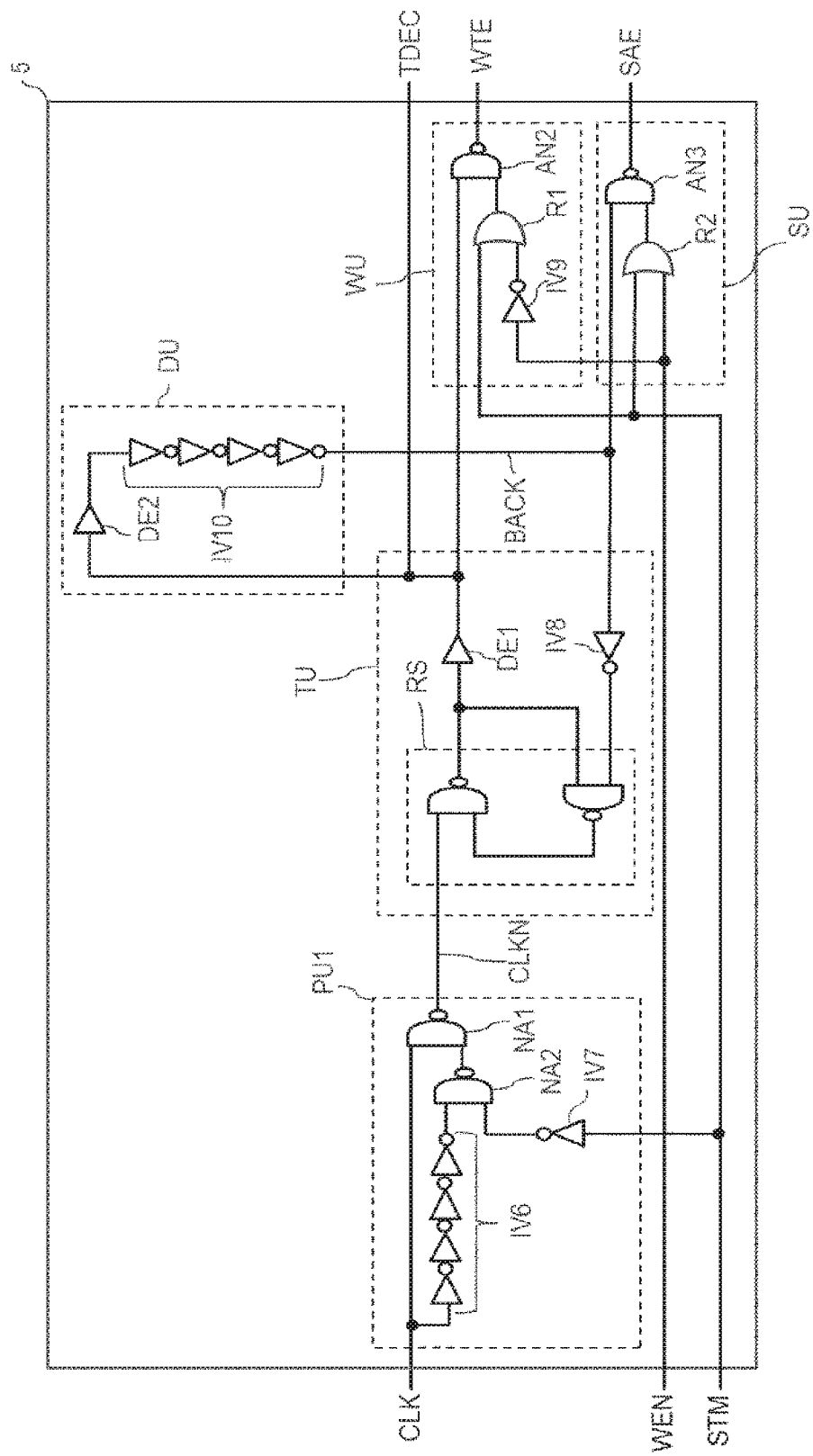
FIG. 4 is a schematic diagram illustrating a configuration example of a control circuit according to a first embodiment.

FIG. 4 is a schematic diagram illustrating a configuration example of a control circuit according to a first embodiment.

The control circuit 5 includes a pulse signal generation circuit PU1, a start-up signal generation circuit TU, a delay signal generation circuit DU, a write signal generation circuit WU, and a read signal generation circuit SU.

The pulse signal generation circuit PU1 includes an inverter group IV6 formed of even-numbered inverters, a plurality of NAND circuits NA1 and NA2, and an inverter IV7. The pulse signal generation circuit PU1 receives the external clock signal CLK and the bypass mode signal STM, generates the pulse signal CLKN by these circuits, and outputs the pulse signal CLKN to the start-up signal generation circuit TU. The inverter group IV6 operates as a delay circuit. Therefore, the inverter group IV6 is not limited to the inverter configuration, and may be a circuit for delaying the external clock signal clock CLK.

The start-up signal generation circuit TU includes an internal latch circuit RS, a delay circuit DE1, and an inverter IV8. The start-up signal generation circuit TU receives the pulse signal CLKN and a delay signal BACK, generates the start-up signal TDEC by these circuits, and outputs the start-up signal TDEC to the write signal generation circuit WU, the delay signal generation circuit DU, the input latches DL1 and DL2, and the word line driving circuit 6.

The write signal generation circuit WU includes a inverter IV9, an OR circuit R1, and an AND circuit AN2. The write signal generation circuit WU receives the start-up signal TDEC, the bypass mode signal STM, and the internal control signal WEN, generates the write control signal WTE by these circuits, and outputs the write control signal WTE to the write driving circuit WTD.

The read signal generation circuit SU includes an OR circuit R2 and an AND circuit AN3. The read signal generation circuit SU receives the delay signal BACK, the bypass mode signal STM, and the internal control signal WEN, generates the read control signal SAE by these circuits, and outputs the read control signal SAE to the read driving circuit SA and the output latch QL. The delay signal generation circuit DU includes a delay circuit DE2 and an inverter group IV10 formed of even-numbered inverters. The delay signal generation circuit DU receives the start-up signal TDEC and generates the delay signal obtained by delaying the start-up signal TDEC by these circuits. The inverter group IV10 operates as a delay circuit. Therefore, the inverter group IV10 is not limited to the inverter configuration and may be any circuits for delaying the start-up signal TDEC.

Operation of the Semiconductor Device (First Embodiment)

Figure 5:
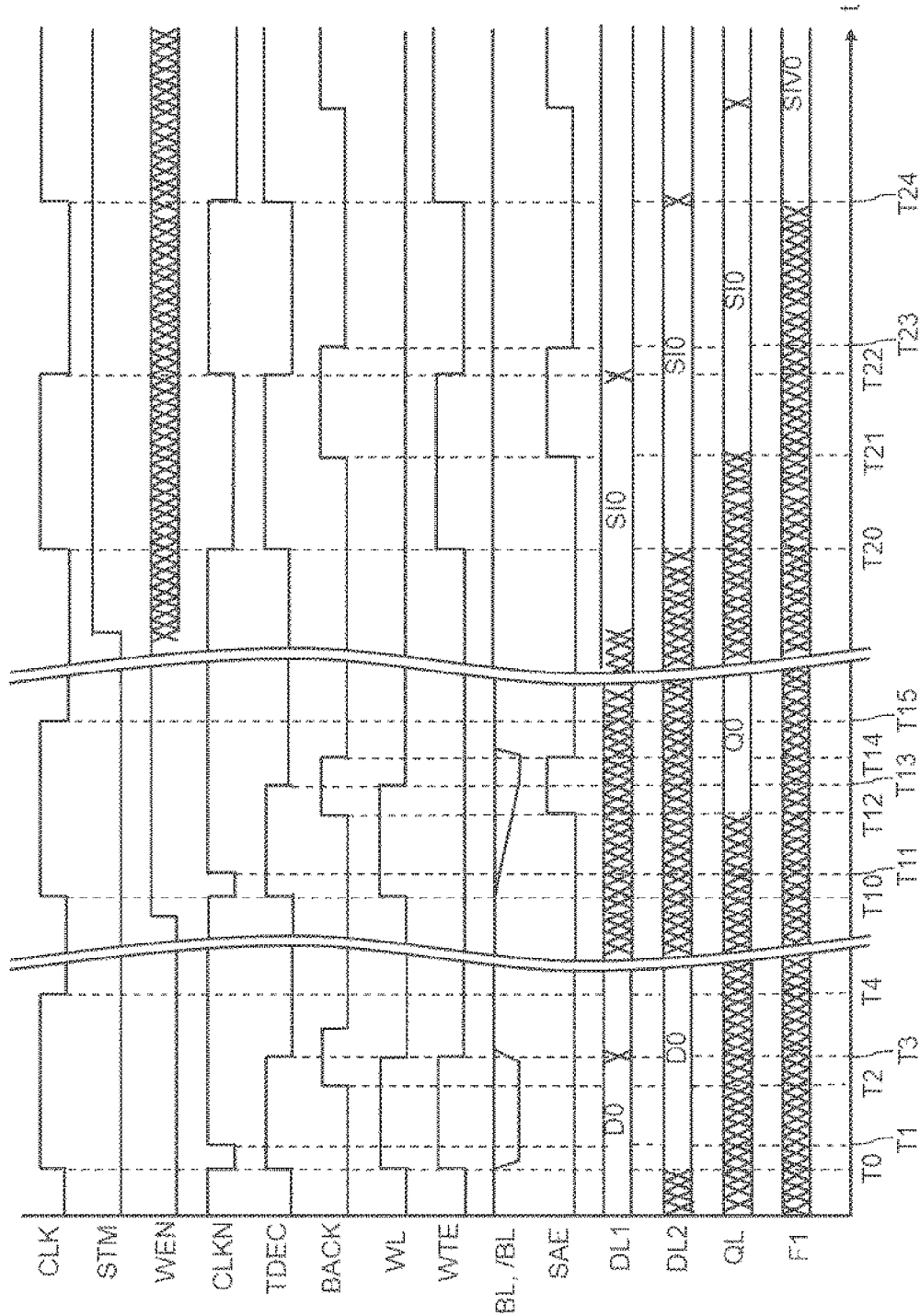
FIG. 5 is a timing chart for explaining an operation of the semiconductor device including the control circuit according to the first embodiment.

FIG. 5 is a timing chart for explaining an operation of the semiconductor device including the control circuit according to the first embodiment. In FIG. 5, a data D0 is shown as data D used in the writing operation, and a data Q0 is shown as data Q used in the reading operation. In FIG. 5, a test data SI0 is shown as test data SI used in the test operation, and a test data SIV0 is shown as test data SIV used in the test operation. The input latches DL1 and DL2 and the output latch QL shown in FIG. 5 are circuits in the input/output circuit IO1.

The following writing, reading and test operations of semiconductor device 1 are described using the input/output circuit IO1 in the plurality of input/output circuits.

Writing Operation (First Embodiment)

The writing operation of the first embodiment will be described below with reference to FIGS. 3, 4 and 5.

At the time of the writing operation, the internal control signal WEN is maintained at a "L" level, and the bypass mode signal STM is maintained at a "L" level.

At time T0, the selector SL shown in FIG. 3 selects the data D0 based on the bypass mode signal STM of the "L" level and outputs the data D0 to the input latch DL1.

At the time T0, the pulse signal generation circuit PU1 shown in FIG. 4 generates the pulse signal CLKN based on a rising of the external clock signal CLK and the bypass mode signal STM of the "L" level. Also, in the writing operation, since the bypass mode signal STM is maintained at a constant level, the pulse signal CLKN is activated substantially based on the rising of the external clock CLK. That is, the pulse signal CLKN falls.

At the time T0, the start-up signal generation circuit TU shown in FIG. 4 generates the start-up signal TDEC based on the falling of the pulse signal CLKN. Since the start-up signal TDEC is transitioned based on the pulse signal CLKN, the start-up signal TDEC is activated substantially based on the rising of the external clock CLK. That is, the start-up signal TDEC rises.

At the time T0, the input latch DL1 shown in FIG. 3 holds the data D0 output from the selector SL based on the rising of the start-up signal TDEC, and outputs the data D0 to the write driving circuit WTD and the input latch DL2. The input latch DL2 receives the data D0 input from the input latch DL1 based on the rising of the start-up signal TDEC.

At the time T0, the word line driving circuit 6 shown in FIG. 3 drives the corresponding word line WL based on the rising of the start-up signal TDEC, the bypass mode signal STM of the "L" level, and the row selection control signal X. That is, the corresponding word line WL is activated, and a potential of the corresponding word line WL is transitioned from a "L" level to a "H" level.

At the time T0, the write signal generation circuit WU shown in FIG. 4 generates the write control signal WTE based on the rising of the start-up signal TDEC, the bypass mode signal STM of the "L" level and the internal control signal WEN of the "L" level. Also, in the writing operation, since the bypass mode signal STM and the internal control signal WEN are maintained at the constant level, and the write control signal WTE is transitioned based on the start-up signal TDEC, the write control signal WTE is activated substantially based on the rising of the external clock CLK. That is, the write control signal WTE rises.

At time the T0, the write driving circuit WTD shown in FIG. 4 is driven based on the rising of the write control signal WTE. That is, the write driving circuit WTD is activated. As a result, the write driving circuit WTD drives the data line pair CBP in accordance with the data D0 input from the input latch DL1 and the data line pair CBP is activated. The multiplexer MUX couples the data line pair CBP with a corresponding bit line pair BLP in the plurality of bit line pairs BLP according to the column selection control signal Y. As a result, a potential of one of the bit lines BL and/BL of the corresponding bit line pair BLP transitions from a "H" level to a "L" level in accordance with the data D0. At this time, since the corresponding word line WL is driven and activated, the data D0 is written to the memory cell MC. Therefore, the write driving circuit WTD writes the data D0 to the memory cell MC coupled with the corresponding bit line pair BLP and the corresponding word line WL based on the rising of the write control signal WTE.

At time T1, as described above, since the bypass mode signal STM is set to the "L" level, the pulse signal CLKN rises. Thus, pulse signal CLKN is maintained at the "L" level during a delay time (during from the time T0 to the time T1) by the inverter group IV6. The pulse signal CLKN of the "H" level is input to the internal latch circuit RS, but the internal latch circuit RS maintains the start-up signal TDEC at the "H" level.

At time T2, the delay signal generation circuit DU shown in FIG. 4 generates the delay signal BACK obtained by delaying the start-up signal TDEC. Also, since the delay signal BACK is obtained by delaying the start-up signal TDEC, the delay signal BACK is activated substantially based on the rising of the external clock signal CLK. That is, the delay signal BACK rises. A time (from the time T0 to the time T2) for delaying the start-up signal TDEC described above is designed to correspond to a time required for the read driving circuit SA to obtain a potential difference by which the data held in the memory cell MC can be read out via the bit line pair BLP in the reading operation.

At time T3, the start-up signal generation circuit TU shown in FIG. 4 lowers the start-up signal TDEC based on the rising of the delay signal BACK. Therefore, the start-up signal TDEC is activated for a predetermined period of time based on the rising of the external clock signal CLK, and then deactivated based on the rising of the delay signal BACK generated in the control circuit 5. That is, the control signal TDEC falls. The time from the time T2 to the time T3 in FIG. 5 is a time delayed by the circuits in the start-up signal generation circuit TU.

At the time T3, the input latch DL2 shown in FIG. 3 holds the data D0 based on the falling of the start-up signal TDEC, and outputs the data to the selector SL of the input/output circuit IO2 in the next stage as the test data SI. However, since the bypass mode signal STM is set to the "L" level, the selector SL of the input/output circuit IO2 in the next stage does not select the data to be inputted as the test data SI. Therefore, the scan chain is not configured in the writing operation.

At the time T3, the write signal generation circuit WU shown in FIG. 4 lowers the write control signal WTE based on the falling of the start-up signal TDEC, the bypass mode signal STM of the "L" level, and the internal control signal WEN of the "L" level. Therefore, the write control signal WTE is activated for a predetermined period of time based on the rising of the external clock signal CLK, and then deactivated based on the rising of the delay signal BACK generated in the control circuit 5. That is, the write control signal WTE falls.

At the time T3, the write driving circuit WTD shown in FIG. 4 is deactivated based on the falling of the write control signal WTE. Thus, the writing operation is completed.

Therefore, in the writing operation, the control circuit 5 generates the start-up signal TDEC and the write control signal WTE, which are the control signal CS1, based on the rising of the external clock signal CLK. In the writing operation, the control signal CS1 is regarded as the start-up signal TDEC and the write control signal WTE. That is, the control signal CS1 is activated, and thereby the input/output circuit IO0 writes the data D0 to the memory cell MC. On the other hand, the control circuit 5 deactivates the control signal CS1 based on the rising of the delay signal BACK and not based on (without being affected by) a falling of the external clock signal CLK at time T4. Accordingly, the writing operation of the data D0 is completed.

In other words, the control circuit 5 at the time of the writing operation activates the control signal CS1 for a predetermined period of time by using the rising of the external clock signal CLK as a trigger. Therefore, since it is enough to consider the rising of the external clock signal CLK, it is easy to design a timing of the writing operation.

Further, the control circuit 5 is not limited to the above-described operation and may have a circuit configuration that activates the control signal CS1 for the predetermined period of time based on the falling of the external clock CKL. In other words, in the writing operation, the control circuit 5 activates the control signal CS1 based on either the rising or the falling of the external clock signal CLK within a single cycle of the external clock signal CLK. That is, the control circuit 5 raises the control signal CS1. Accordingly, the input/output circuit IO1 is activated to write the data D0 to the memory cell MC.

Reading Operation (First Embodiment)

The reading operation of the first embodiment will be described below with reference to FIGS. 3, 4 and 5. A detailed description of the same operation as the above-described writing operation is omitted.

Unlike in the writing operation, in the reading operation, the internal control signal WEN is maintained at a "H" level. The bypass mode signal STM is maintained at the "L" level.

As with the time T0 in the write operation, at time T10, the pulse signal CLKN and the start-up signal TDEC are generated.

As with the time T1 of the writing operation, at time T11, since the bypass mode signal STM is set to the "L" level, the pulse signal CLKN rises.

As with the time T2 in the writing operation, at time T12, the delay signal generation circuit DU shown in FIG. 4 generates the delay signal BACK obtained by delaying the start-up signal TDEC. Therefore, the delay signal BACK is activated based on a rising of the external clock signal CLK, as with the writing operation. That is, the delay signal BACK rises.

At the time T12, the read signal generation circuit SU shown in FIG. 4 generate the read control signal SAE based on a rising of the delay signal BACK, the bypass mode signal STM of the "L" level and the internal control signal WEN of the "H" level. In the reading operation, since the bypass operation mode signal STM and the internal control signal WEN are maintained at constant levels and the control signal SAE is transitioned based on the delay signal BACK, the read control signal SAE is activated substantially based on the rising of the external clock signal CLK. That is, the read control signal SAE rises.

At time the T12, the read driving circuit SA shown in FIG. 3 is driven (activated) by the rising of the read control signal SAE. The multiplexer MUX couples the data line pair CBP with a corresponding bit line pair BLP in the plurality of bit line pair BLP according to the column selection control signal Y.

At the time T12, since the corresponding word line WL is driven (activated) as with the writing operation, the read driving circuit SA outputs the data Q0 held by the memory cell MC to the output latch QL via the corresponding bit line pair BLP, the multiplexer MUX and the data line CBP. Therefore, the read driving circuit SA outputs the data held by the memory cell MC coupled with the corresponding bit line pair BLP and the corresponding word line WL to the output latch QL based on the rising of the read control signal SAE.

At time the T12, the output latch QL shown in FIG. 3 receives the data Q0 input from the read driving circuit SA based on the rising of the read control signal SAE.

Next, at time T13, as with the time T3 in the writing operation, the start-up signal TDEC falls.

Next, at time T14, the delay signal generation circuit DU shown in FIG. 4 lowers the delay signal BACK based on the falling of the start-up signal TDEC at the time T13. Therefore, the delay signal BACK is activated for a predetermined period of time based on the rising of the external clock signal CLK, and then deactivated based on the falling of the start-up signal TDEC. That is, the delay signal BACK falls.

At the time T14, the read signal generation circuit SU shown in FIG. 4 lowers the read control signal SAE based on the falling of the delay signal BACK, the bypass mode signal STM of the "L" level and the internal control signal WEN of the "H" level. Therefore, in the reading operation, since the bypass operation mode signal STM and the internal control signal WEN are maintained at the constant levels, and the control signal SAE is transitioned based on the delay signal BACK, the read control signal SAE is activated for a predetermined period of time based on the rising of the external clock signal CLK. Thereafter, the read control signal SAE is deactivated based on the falling of the start-up signal TDEC. That is, the read control signal SAE falls.

At time the T14, the read driving circuit SA shown in FIG. 3 is not driven (not activated) based on the falling of the read control signal SAE. As a result, the read driving circuit SA do not read the data Q0 held by the memory cell MC.

At time the T14, the output latch QL shown in FIG. 3 holds the data Q0 input from the read driving circuit SA based on the falling of the read control signal SAE, and outputs the data Q0 to the logic circuit L1. Thus, the reading operation is completed.

Thus, in the reading operation, the control circuit 5 generates the read control signal SAE, which is the control signal CS1, based on the rising of the external clock signal CLK. In the reading operation, the control signal CS1 is regarded as the read control signal SAE. The read control signal SAE is activated, whereby the read driving circuit SAE reads the data Q0 held by the memory cell MC. On the other hand, the control circuit 5 deactivates the control signal CS1 based on the falling of the start-up signal TDEC and not based on (without being affected by) a falling of the external clock signal CLK at time T15. Accordingly, the output latch QL outputs the data Q0 to the logic circuit L1, and the read driving circuit SA is not driven and is deactivated. Thus, the reading operation of the data Q0 is completed.

In other words, as with the writing operation, the control circuit 5 activates the control signal CS1 for a predetermined period of time by using the rising of the external clock signal CLK as a trigger. Therefore, since it is enough to consider the rising of the external clock signal CLK, it is easy to design a timing of the reading operation.

Further, the control circuit 5 is not limited to the above-described operation and may have a circuit configuration that activates the control signal CS1 based on the falling of the external clock CKL for a predetermined period of time. In other words, in the reading operation, the control circuit 5 activates the control signal CS1 based on either the rising or the falling of the external clock signal CLK within a single cycle of the external clock signal CLK. That is, the control circuit 5 raises the control signal CS1. Accordingly, the input/output circuit IO1 is activated to read the data Q0 held by the memory cell MC.

Test Operation (First Embodiment)

The test operation of the first embodiment will be described below with reference to FIGS. 3, 4 and 5. A detailed description of the same operation as the above-described writing and reading operations is omitted.

Unlike the writing operation and the reading operation, in the test operation, the bypass mode signal STM is maintained at a "H" level. Thereby, a bypass operation of the memory circuit 3 is started. The internal control signal WEN is maintained at an indefinite state. The bypass operation of the memory circuit 3 is performed if the bypass mode signal STM is at the "H" level regardless of the state of the internal control signal WEN.

At time T20, the selector SL shown in FIG. 3 selects the test data SI (SI0) input via the scan-in terminal P2 based on the bypass mode signal STM of the "H" level, and outputs the test data SI to the input latch DL1.

At time the T20, the pulse signal generation circuit PU1 shown in FIG. 3 generates the pulse signal CLKN based on a rising of the external clock signal CLK and the bypass mode signal STM of the "H" level. Thus, in the test operation, since the bypass mode signal STM is maintained at constant level, as with the writing and reading operations, the pulse signal CLKN is activated substantially based on the rising of the external clock signal CLK. That is, pulse signal CLKN falls.

However, unlike the writing and reading operations, since the bypass mode signal STM is at the "H" level, the pulse signal CLKN is maintained at the "L" level while the external clock signal CLK is at the "H" level (during form the time T20 to the time T22) regardless of the delay time by the inverter group IV6.

At the time T20, the start-up signal generation circuit TU shown in FIG. 4 generates the start-up signal TDEC, as with the time T0 in the writing operation or the time T10 in the reading operation. Thus, start-up signal TDEC is activated substantially based on the rising of the external clock signal CLK, as with the writing and reading operations. That is, the start-up signal TDEC rises.

At the time T20, the input latch DL1 shown in FIG. 3 holds the test data SI0 output from the selector SL based on the rising of the start-up signal TDEC, and outputs the test data SI0 to the write driving circuit WTD and the input latch DL2.

At the time T20, the input latch DL2 shown in FIG. 3 receives the test data SI0 output from the input latch DL1 based on the rising of the start-up signal TDEC.

At the time T20, the word line driving circuit 6 shown in FIG. 3, unlike the writing and reading operations, does not drive the plurality of word lines WL based on the bypass mode signal STM of the "H" level and the rising of the start-up signal TDEC. That is, the plurality of word lines WL are deactivated. Specifically, the word line driving circuit 6 receives the start-up signal TDEC of a "H" level and the bypass mode signal STM of the "H" level. Accordingly, the word line driving circuit 6 generates a signal, which is at the "L" level, by the AND circuit AN1 and the inverter IV5, and outputs the signal to the plurality of word drivers WD. As a result, the plurality of word drivers WD do not drive the plurality of word lines WL and deactivate the plurality of word lines WL.

At the time T20, the write signal generation circuit WU shown in FIG. 4 generates the write control signal WTE based on the rising of the start-up signal TDEC, the bypass mode signal STM of the "H" level and the internal control signal WEN of the indefinite state. Therefore, in the test operation, since the bypass mode signal STM is maintained at a constant level, and the internal control signal WEN is set at the indefinite state, the write control signal WTE is activated substantially based on the rising of the external clock CLK, as with the writing and reading operations. That is, the write control signal WTE rises.

At the time T20, the write driving circuit WTD shown in FIG. 3 is driven (activated) based on the transition of the write control signal WTE. As a result, the write driving circuit WTD drives and activates the data line pair CBP in accordance with the test data SI0 input from the input latch DL1. As a result, the test data SI0 is output to the data line pair CBP. Unlike the writing and reading operations, the column selection control signal Y is set to be inactive. Accordingly, the multiplexer MUX does not couple the bit line pair BLP with the data line pair CBP. Therefore, the test data SI0 is not output to the bit line pair BLP.

Also, even if the bit line pair BLP and the data line pair CBP are connected via the multiplexer MUX, the test data SI0 is not written to the memory cell MC because the plurality of word lines WL are not driven.

At time T21, the delay signal generation circuit DU shown in FIG. 4 generates the delay signal BACK obtained by delaying the start-up signal TDEC, as with the time T2 in the writing operation or the time T12 in the reading operation. Therefore, the delay signal BACK is activated substantially based on the rising of the external clock signal CLK. That is, the delay signal BACK rises. Although the delay signal BACK transitions from a "L" level to a "H" level, the start-up signal generation circuit TU outputs the start-up signal TDEC while maintaining the TDEC at the "H" level, unlike the writing and reading operations. Because the pulse signal CLKN input to the internal latch circuit RS is maintained at the "L" level, the internal latch circuit RS keeps on holding the start-up signal TDEC of the "H" level.

At the time T21, the read signal generation circuit SU shown in FIG. 4 generates the read control signal SAE based on the rising of the delay signal BACK, the bypass mode signal STM of the "H" level and the internal control signal WEN of the indefinite state. Thus, in the test operation, since the bypass mode signal STM is maintained at the constant level, and the internal control signal WEN is set at the indefinite state, the read control signal SAE is activated substantially based on the rising of the external clock signal CLK, as with the reading operation. That is, the read control signal SAE rises.

At the time T21, the read driving circuit SA shown in FIG. 3 is driven based on the rising of the read control signal SAE and activated. The read driving circuit SA amplifies a potential difference between the data line CBL and /CBL of the data line pair CBP according to the test data SI0 input from the write driving circuit WTD to the data line pair CBP, and outputs the test data SI0 to the output latch QL. Thus, in the test operation, the test data SI0 is transferred from the write driving circuit WTD to the read driving circuit SA via the data line pair CBP without via the memory array 4.

At the time T21, the output latch QL shown in FIG. 3 receives the test data SI0 input from the read driving circuit SA based on the falling of the read control signal SAE.

Next, at time T22, the pulse signal generation circuit PU1 shown in FIG. 3 lowers the bypass mode signal STM based on a falling of the external clock signal CLK and the pulse signal CLKN of the "H" level. In other words, since the bypass mode signal STM is maintained at the constant level, the pulse signal CLKN is deactivated substantially based on the falling of the external clock signal CLK. That is, the pulse signal CLKN falls.

At the time T22, the start-up signal generation circuit TU shown in FIG. 4 lowers the start-up signal TDEC based on the rising of the pulse signal CLKN. Therefore, since the start-up signal TDEC is transitioned based on the pulse signal CLKN, the start-up signal TDEC is deactivated substantially based on the falling of the external clock signal CLK. That is, the start-up signal TDEC falls.

At the time T22, the input latch DL2 shown in FIG. 3 holds the test data SI0 output from the input latch DL1 based on the falling of the start-up signal TDEC, and outputs the test data SI0 to the selector SL of the input/output circuit IO2 in the next stage. Since the bypass mode signal STM is set at the "H" level, the selector SL of the input/output circuit IO2 in the next stage selects the test data SI0 and outputs the test data SI0 to the input latch DL1 (not shown) of the input/output circuit IO2. Therefore, the plurality of input/output circuits IO1 and IO2 comprising the scan chain shift the test data SI0 in the connection order of the scan chain based on the start-up signal TDEC.

At the time T22, the write signal generation circuit WU shown in FIG. 4 lowers the write control signal WTE based on the falling of the start-up signal TDEC, the bypass mode signal STM of the "H" level and the internal control signal WEN of the indefinite state. Therefore, in the test operation, since the bypass mode signal STM is maintained at the constant level, the internal control signal WEN is set at the indefinite state and the write control signal WTE is transitioned based on the start-up signal TDEC, the write control signal WTE is deactivated substantially based on the falling of the external clock signal CLK. That is, the write control signal WTE falls.

At the time T22, the write driving circuit WTD is not driven based on the falling of the write control signal WTE and is deactivated. As a result, the test data SI0 is not output to the data line pair CBP.

At time T23, the delay signal generation circuit DU shown in FIG. 4 lowers the delay signal BACK based on the falling of the start-up signal TDEC at the time T22. Therefore, since the delay signal BACK transitions based on the start-up signal TDEC, the delay signal BACK is deactivated substantially based on the falling of the external clock signal CLK. That is, the delay signal BACK falls.

At the time T23, the read signal generation circuit SU shown in FIG. 4 lowers the read control signal SAE based on the falling of the delay signal BACK, the bypass mode signal STM of the "H" level, and the internal control signal WEN of the indefinite state. Therefore, in the test operation, since the bypass mode signal STM is maintained at the constant level, the internal control signal WEN is set at the indefinite state, and the read control signal SAE is transitioned based on the delay signal BACK, the read control signal SAE is deactivated substantially based on the falling of the external clock signal CLK. That is, the read control signal SAE falls.

At the time T23, the read driving circuit SA shown in FIG. 3 is not driven based on the falling of the read control signal SAE and is deactivated. As a result, the read driving circuit SA does not output the test data SI0, which is input from the write driving circuit WTD via the data line pair CBP, to the output latch QL.

At the time T23, the output latch QL holds the test data SI0, which is input from the read driving circuit SA, based on the falling of the read control signal SAE, and outputs the test data SI0 to the logic circuit L1 shown in FIG. 1.

Accordingly, the logic circuit L1 shown in FIG. 1 receives the test data SI0 from the input/output circuit IO1, performs the required processing, and outputs the processing result data to the flip-flop F1 as the test data SIV0.

At time T24, the flip-flop F1 holds the test data SIV0 based on a rising of the external clock signal CLK (a rising following the rising of the external clock signal CLK at the time T20).

Thereafter, the scan mode control signal SMC is set at a "H" level, and the test data SIV0 held by the flip-flop F1 is outputted as the test result signal SO via the scan-out terminal P3. The test device (not shown) compares the test result signal SO output from the semiconductor device 1 with an expectation value to determine whether or not the logic circuit L1, which is the test object, is defective. Similarly, the above-described operation is performed in the input/output circuit IO2, the logic circuit L2 and the flip-flop F2. Thus, the testing for the plurality of logic circuits in the semiconductor device 1 is completed.

Thus, in the test operation, the test data SI is transferred by the control circuit 5 to the logic circuit L1 via the input/output circuit IO1, which is used as a data transmission path in the writing and reading operations. Therefore, there is no need to provide a dedicated data transmission path for the test data SI. The input/output circuit IO1 is controlled by the shared control circuit 5 not only in the writing and reading operations, but also in the test operation. Therefore, there is no need to provide a dedicated control circuit for the test operation. That is, the semiconductor device 1 can be miniaturized.

The test data SI is transferred to the logic circuit L1 without via the memory array 4. In other words, in the test operation, the bypass operation for bypassing the memory array 4 is performed. As a result, the test data SI is transferred to the logic circuit L1 without being affected by the data held in the memory cell MC. Therefore, a highly reliable test for the semiconductor device 1 can be performed.

Further, at the time of the test operation, the control circuit 5 generates the control signal CS1 based on the rising of the external clock signal CLK. In the test operation of the first embodiment, the control signal CS1 is regarded as the start-up signal TDEC, the write control signal WTE, and the read control signal SAE. That is, the control signal CS1 is activated, and accordingly, the input latch DL1 outputs the test data SI, and the write control circuit WTD and the read control circuit SA are driven and activated. As a result, the test data SI is output to the output latch QL via the input latch DL1, the write control circuit WTD, the data line pair BLP, and the read control circuit SA within the input/output circuit IO1. On the other hand, the control circuit 5 deactivates the control signal CS1 based on the falling of the external clock signal CLK. Accordingly, the output latch QL outputs the test data SI, which is input from the read control circuit SA, to the logic circuit L1. The write control circuit WTD and the read control circuit SA are not driven and deactivated. As a result, the test data SI is not outputted to the output latch QL.

In other words, in the test operation, the control circuit 5 raises and lowers the control signal CS1 based on the rising and falling of the external clock signal CLK within a single cycle of the external clock signal CLK. Accordingly, the input/output circuit IO1 is activated and deactivated, and the test data SI is outputted to the logic circuit L1 via the input/output circuit IO1. The control circuit 5 is not limited to the above-described operation and may have a circuit configuration that raises the control signal CS1 based on the falling of the external clock CKL and lowers the control signal CS1 based on the rising of the external clock CKL.

The pulse widths of the control signals CS1 and CS2 generated at the time of the test operation differ from the pulse widths of the control signals CS1 and CS2 generated at the time of the writing and reading operations. For example, as shown in FIG. 5, the pulse width (a range from the time T20 to the time T22) of the control signal CS1 (the start-up signal TDEC) generated at the time of the test operation is longer than the pulse width (a range from the time T0 to time T3) of the control signal CS1 (the start-up signal TDEC) generated at the time of the writing operation. Because, in the test operation, the control circuit 5 receives the bypass mode signal STM of the "H" level (a first level), and accordingly the control signal CS1 synchronized with the rising and falling of the external clock signal CLK is generated. On the other hand, because, in the writing and reading, the control circuit 5 receives the bypass mode signal STM of the "L" level (a second level), and accordingly the control signal CS1 synchronized with the rising of the external clock signal CLK and not synchronized with the falling of the external clock signal CLK is generated.

If a frequency of the external clock signal CLK is changed in the test operation, the pulse width (a range from the time T20 to the time T22) of the external clock signal CLK is changed. Therefore, the pulse width of the control signal CS1 is also changed accordingly. Moreover, an activation period of the write control circuit WTD, the activation period of the read control circuit SA, a data holding period of the input latch DL1, a data receiving period of the input latch DL2, and a data receiving period of the output latch QL in the input/output circuit IO1 are also changed accordingly. That is, the control circuit 5 generates the control signal CS1 synchronized with the pulse width of the external clock signal CLK. This purpose will be described later in comparison with a control circuit 7 previously studied by the present inventor.

Further, at the time of the test operation, the operation of the control circuit 5 described above is premised on the case where the fall timing (the time T22) of the external clock signal CLK is later than the rise timing (the time T21) of the delay signal BACK.

At the time of the test operation, when the fall timing of the external clock signal CLK is earlier than the rise timing of the delay signal BACK, the control signal CS1 is deactivated at the same timing as the above-described the writing and reading operations. Therefore, the control circuit 5 raises the control signal CS1 (the start-up signal TDEC, the write control signal WTE, and the read control signal SAE) based on the rising of the external clock signal CLK, and activates the control signal CS1 for a predetermined period of time.

Even if the frequency of the external clock signal CLK is increased and the pulse width of the external clock signal CLK is shortened, the control signal CS1 (the start-up signal TDEC, the write control signal WTE, and the read control signal SAE) is not deactivated based on the falling of the external clock signal CLK. Therefore, the control circuit 5 can be prevented from malfunctioning.

Previous Examination Example

Figure 6:
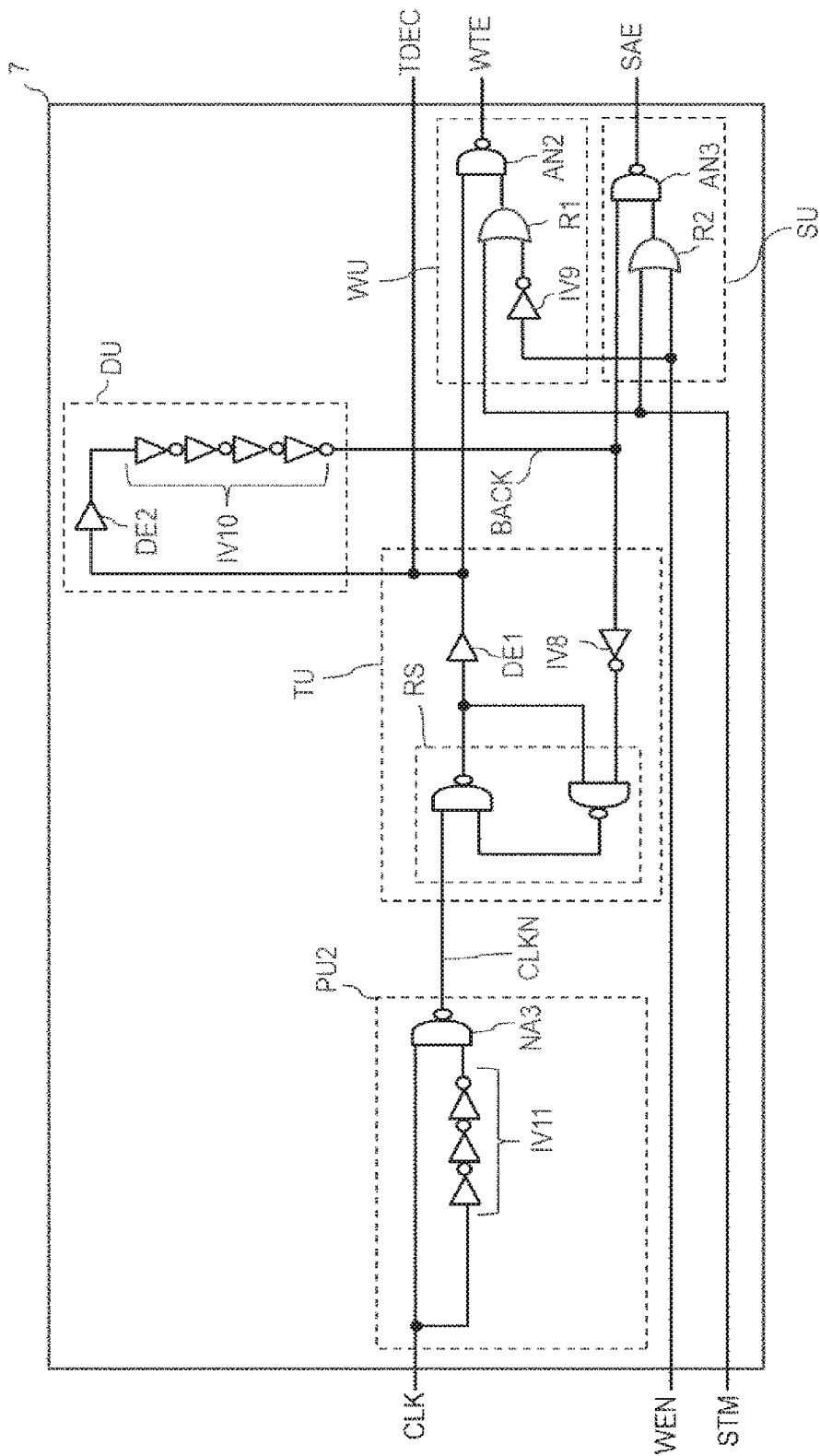
FIG. 6 is a schematic diagram for explaining a configuration example of a control circuit previously studied by the present inventor.

FIG. 6 is a schematic diagram for explaining a configuration example of a control circuit previously studied by the present inventor.

Configuration of Control Circuit (Previous Examination Example)

The control circuit 7 is a circuit previously studied by the present inventor. The control circuit 7 includes a pulse signal generation circuit PU2 instead of the pulse signal generation circuit PU1 in the control circuit 5. The components other than the pulse signal generation circuit PU2 are the same as those of the control circuit 5, and thus the same reference numerals are given, and the descriptions thereof are omitted.

The pulse signal generation circuit PU2 includes an inverter group IV11 formed of odd-numbered inverters and a NAND circuit NA3. The pulse signal generation circuit PU2 receives the external clock signal CLK, generates the pulse signal CLKN by these circuits, and outputs the pulse signal CLKN to the start-up signal generation circuit TU. The inverter group IV11 operates as a delay circuit and a circuit for inverting a signal. Therefore, the inverter group IV11 is not limited to the inverter configuration and may be a circuit that delays the external clock signal CLK and outputs an inverted signal.

The pulse signal generation circuit PU2, unlike the pulse signal generation circuit PU1 of the control circuit 5, does not receive the bypass mode signal STM.

Test Operation (Previous Examination Example)

Figure 7:
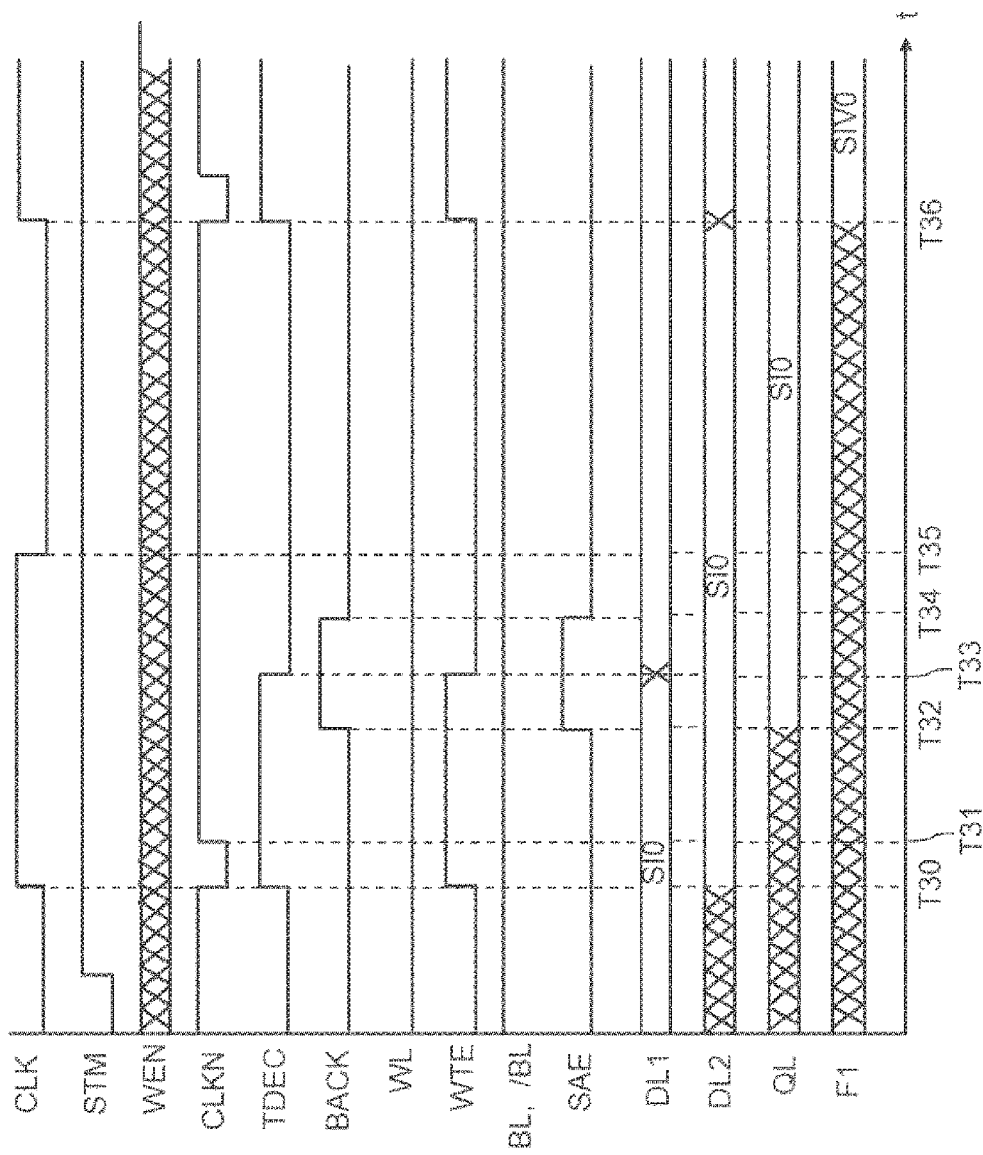
FIG. 7 is a timing chart for explaining a test operation of a semiconductor device including the control circuit previously studied by the present inventor.

FIG. 7 is a timing chart for explaining a test operation of the semiconductor device including the control circuit previously studied by the present inventor. In FIG. 7, as with FIG. 5, the input latches DL1 and DL2 and the output latch QL of the input/output circuit IO1, the flip-flop F1, and the test data SI0 and the test data SIV0 are shown.

Referring to FIGS. 1, 3, 6, and 7, the test operation of the previous examination example will be described. A detailed description of the same operation as the above-described first embodiment is omitted. The following test operation of the previous examination example is described using the input/output circuit IO1 in the plurality of input/output circuits.

As with the test operation of the semiconductor device 1 including the control circuit 5, the bypass mode signal STM is set at the "H" level and the internal control signal WEN is set at the indefinite state. Therefore, at time T30, the selector SL shown in FIG. 3 selects the test data SI (SI0) and outputs the test data SI (SI0) to the input latch DL1.

At the time T30, the pulse signal generation circuit PU2 shown in FIG. 6 generates the pulse signal CLKN based on a rising of the external clock signal CLK. the pulse signal CLKN is maintained at the "L" level during a delay time (during from the time T30 to time T31) by inverter group IV11. Therefore, in the test operation of the previous examination example, the pulse signal CLKN falls not based on (without being affected by) the falling of the external clock signal CLK, unlike the pulse signal CLKN in the test operation of the first embodiment. In other words, the pulse signal CLKN in the test operation of the previous examination example is similar to the pulse signal CLKN in the writing and reading operations of the first embodiment.

Since the configuration of the control circuit 7 other than the pulse signal generation circuit PU2 is the same as that of the control circuit 5, the operation after the time T30 of the previous examination example is mainly the same as the writing operation or reading operation of the first embodiment. Specifically, at the time T30, the control circuit 7 activates the start-up signal TDEC and the write control signal WTE as with the time T0 in the writing operation of the control circuit 5. At time T32, the control circuit 7 activates the delay signal BACK and the read control signal SAE as with the time T12 in the reading operation of the control circuit 5. At time T33, the control circuit 7 deactivates the start-up signal TDEC and the write control signal WTE as with the time T3 in the writing operation of the control circuit 5. At time T34, the control circuit 7 deactivates the delay signal BACK and the read control signal SAE as with the time T14 in the reading operation of the control circuit 5.

Therefore, the control circuit 7 generates (activates) the control signal CS1 (the start-up signal TDEC, the write control signal WTE and the read control signal SAE) based on the rising of the external clock signal CLK. Accordingly, the test data SI0 is output to the output latch QL via the input latch DL1, the write control circuit WTD, the data line pair BLP, and the read control circuit SA in the input/output circuit IO1.

On the other hand, the control circuit 7 deactivates the control signal CS1 (the start-up signal TDEC and the write control signal WTE) based on the rising of the delay signal BACK signal generated by the rising of the external clock signal CLK and not based on (without being affected by) the falling of the external clock signal CLK at time T35. Similarly, the control signal CS1 (the read control signal SAE) is deactivated based on the falling of the start-up signal TDEC generated by the rising of the external clock signal CLK. Accordingly, the output latch QL outputs the test data SI0, which is input from the read control circuit SA, to the logic circuit L1.

The logic circuit L1 receives the test data SI0. Thereafter, the test data SI0 is output to the flip-flop F1 as the test data SIV0 via the logic circuit L1.

At the time T36, the flip-flop F1 holds the test data SIV0 based on a rising of the external clock signal CLK (a rising following the rising of the external clock signal CLK at the time T30).

A subsequent operation is similar to the test operation of the first embodiment.

Therefore, the control circuit 7 raises the control signal CS1 (the start-up signal TDEC, the write control signal WTE, and the read control signal SAE) based on the rising of the external clock signal CLK and activates the control signal CS1 for a predetermined period of time.

Therefore, if the frequency of the external clock signal CLK is changed and the pulse width of the external clock signal CLK is changed accordingly, the pulse width of the control signal CS1 (the start-up signal TDEC, the write control signal WTE, and the read control signal SAE) generated by the control circuit 5 is not changed. Therefore, the activation period of the write control circuit WTD, the activation period of the read control circuit SA, the data holding period of the input latch DL1, the data receiving period of the input latch DL2, and the data receiving period of the output latch QL in the input/output circuit IO1 are not changed.

Comparison Between Previous Examination Example and First Embodiment

To explain a difference between the previous examination example and the first embodiment, the type of test will be described. The test is roughly divided into a DC (Direct Current) test and an AC (Alternate Current) test. In the scan path test, there are the above-mentioned DC test and AC test.

The DC test is a test for checking a static characteristic of the circuit. For example, a short-open defect of a component in the logic circuit which is a test object, and a voltage value and a current value of the component in the logic circuit are checked by the DC test.

On the other hand, the AC test is a test for checking a dynamic characteristic of the circuit. For example, a timing of transmitting an input signal or an output signal of the logic circuit to be tested, a delay time of the output signal, and a set-up time and a hold time of the input signal are checked by the AC test.

In particular, since the DC test is the test mainly for checking the short-open defect in the circuit, many logic circuits in the semiconductor device are tested at the same time. As a result, a time for the DC test can be shortened and a manufacturing cost of the semiconductor device can be lowered. However, since many circuit blocks in the semiconductor device are simultaneously driven and activated, an excessive current flows as compared with a normal operation (for example, the writing operation or the reading operation described above). As a result, a voltage drop (hereinafter referred to as "IR drop") of a wire for supplying a power supply voltage to the circuit block in the semiconductor device occurs. Therefore, the operation voltage falls below the minimum operation guarantee voltage of the circuit block, and the circuit block malfunctions. For example, a flip-flop switching rate of the circuit block is reduced by the IR drop, and thus a delay is increased. Therefore, when the flip-flop is arranged in a front stage of the logic circuit, which is the test object, the flip-flop cannot normally output the test data to the logic circuit in the next stage. That is, in the DC test, the logic circuit that is normal is determined to be defective, or the logic circuit that is defective is determined to be normal.

However, the flip-flop operates based on the external clock signal as described above. Therefore, when the flip-flop is arranged in the front stage of the logic circuit to be tested, the pulse width of the external clock signal becomes longer by reducing the frequency of the external clock signal if the operation voltage is lowered by the IR drop, and the logic circuit and the flip-flop can secure the minimum operation guarantee voltage for that period. Therefore, the test data input to the flip-flop is normally output to the logic circuit via the flip-flop. Thus, it possible to avoid the above-mentioned problem.

On the other hand, as in the embodiment, the memory circuit may be arranged in a front stage of the logic circuit of the test object. Then, as described above, the test data is output to the logic circuit via the input/output circuit of the memory circuit. At the time of the test operation, the control circuit of the previous examination example cannot change the activation period of the write control circuit WTD, the activation period of the read control circuit SA, the data holding period of the input latch DL1, the data receiving period of the input latch DL2, and the data receiving period of the output latch QL in the input/output circuit IO1 even if the frequency of the external clock signal CLK are reduced. Therefore, it is impossible to secure the minimum operation guarantee voltage of the circuits in the input/output circuit IO1 when the operation voltage drops due to the IR drop during the DC test. In particular, since the data receiving period of the output latch QL is a period (a period from the time T32 to the time T33 in FIG. 7) in which both the write control circuit WTD and the read control circuit SA are activated, the output latch QL cannot receive the test data SI if the data receiving period is short. Accordingly, the test data SI is not output to the logic circuit L1 via the input/output circuit IO1. That is, the DC test can not be performed on many logic circuits in the semiconductor device 1.

However, the control circuit 5 of the first embodiment can lengthen the activation period of the write control circuit WTD, the activation period of the read control circuit SA, the data holding period of the input latch DL1, the data receiving period of the input latch DL2, and the data receiving period of the output latch QL in the input/output circuit IO1 if the frequency of the external clock signal CLK is reduced and the pulse width of the external clock signal CLK is lengthened. Therefore, even if the operation voltage drops due to the IR drop during the DC test, the minimum operation guarantee voltage of the circuits in the input/output circuit IO1 can be secured. In particular, if the activation period of the write control circuit WTD and the activation period of the read control circuit SA become longer, the data receiving period (a period from the time T32 to the time T33 in FIG. 7) of the output latch QL becomes longer. This allows the output latch QL to receive the test data SI during DC test. Accordingly, the test data SI is output to the logic circuit L1 via the input/output circuit IO1.

Thus, the control circuit 5 of first embodiment can perform the DC test on many logic circuits in the semiconductor device 1 by lengthening the pulse width of external clock signal CLK, as compared to the control circuit 7 of the previous examination example. As a result, a time of the DC test can be shortened, and the manufacturing costs of the semiconductor device can be reduced. Further, since the control circuit 5 of the first embodiment can secure the minimum operation guarantee voltage of the circuit block (e.g., the input/output circuit) by lengthening the pulse width of the external clock signal CLK, it is possible to carry out the highly reliable test.

Second Embodiment

Figure 8:
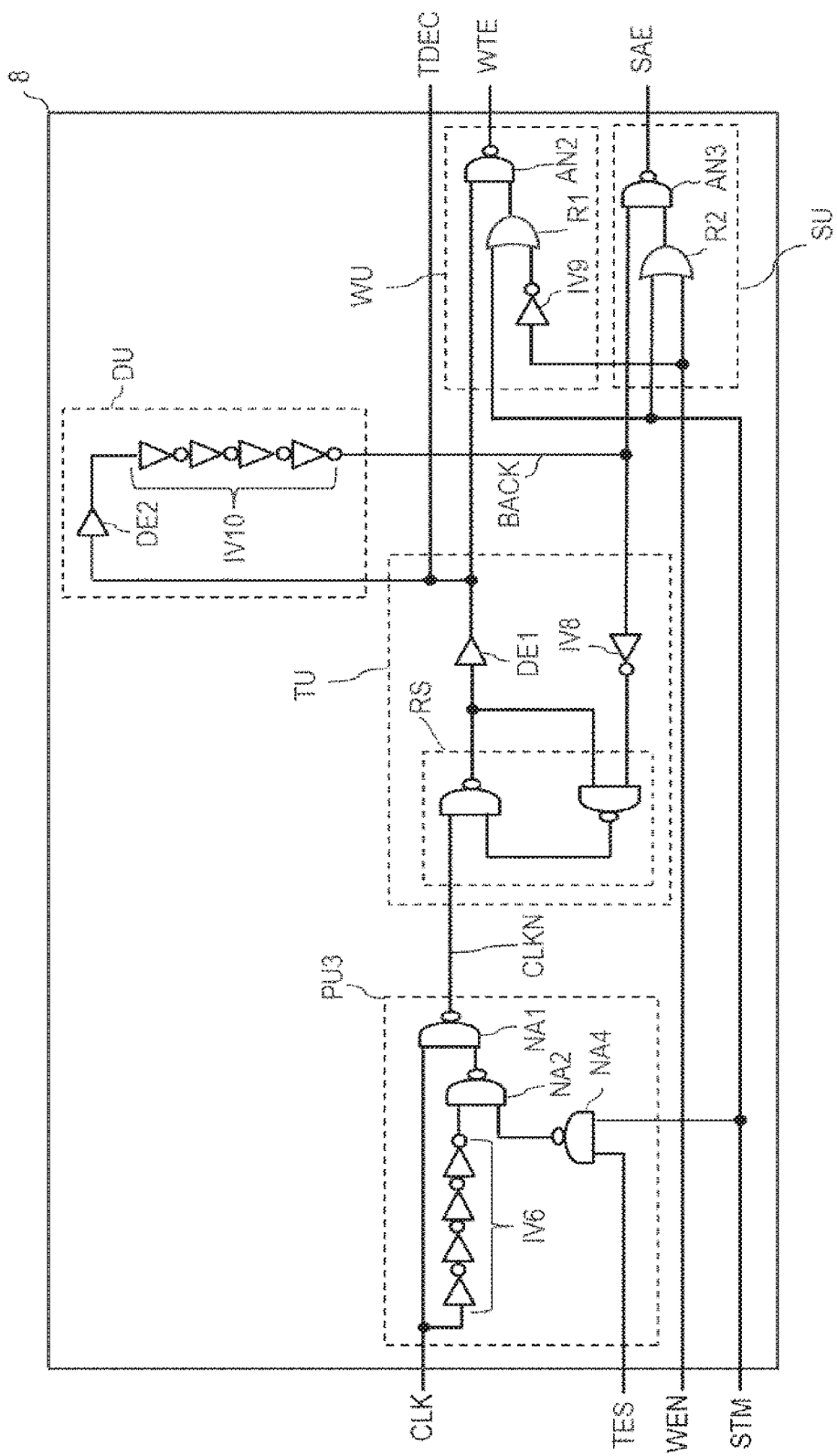
FIG. 8 is a schematic diagram illustrating a configuration example of a control circuit according to a second embodiment.

FIG. 8 is a schematic diagram illustrating a configuration example of a control circuit according to a second embodiment. A control circuit 8 includes a pulse signal generation circuit PU3 including a NAND circuit NA4 instead of the inverter IV7 of the pulse signal generation circuit PU1 in the control circuit 5. Further, a test mode switching signal TES is input to the control circuit 8. Other components are the same as those of the first embodiment, and thus the same reference numerals are given, and the descriptions thereof are omitted.

The test mode switching signal TES is input to the pulse signal generation circuit PU3 of the control circuit 8 and is a signal for switching an execution of the DC test operation or an execution of the AC test operation. The test mode switching signal TES is set to the "H" level in the DC test operation and to the "L" level in the AC test operation. Further, in the writing and reading operations of the memory circuit 2 including the control circuit 8, the test mode switching signal TES is set to a "L" level (not shown).

The pulse signal generation circuit PU3 includes the inverter group IV6 formed of even-numbered inverters, the NAND circuit NA1, the NAND circuit NA2, and the NAND circuit NA4. The pulse signal generation circuit PU3 receives the external clock signal CLK, the test mode switching signal TES, and the bypass mode signal STM, generates the pulse signal CLKN by these circuits, and outputs the pulse signal CLKN to the start-up signal generation circuit TU.

Test Operation (Second Embodiment)

Figure 9:
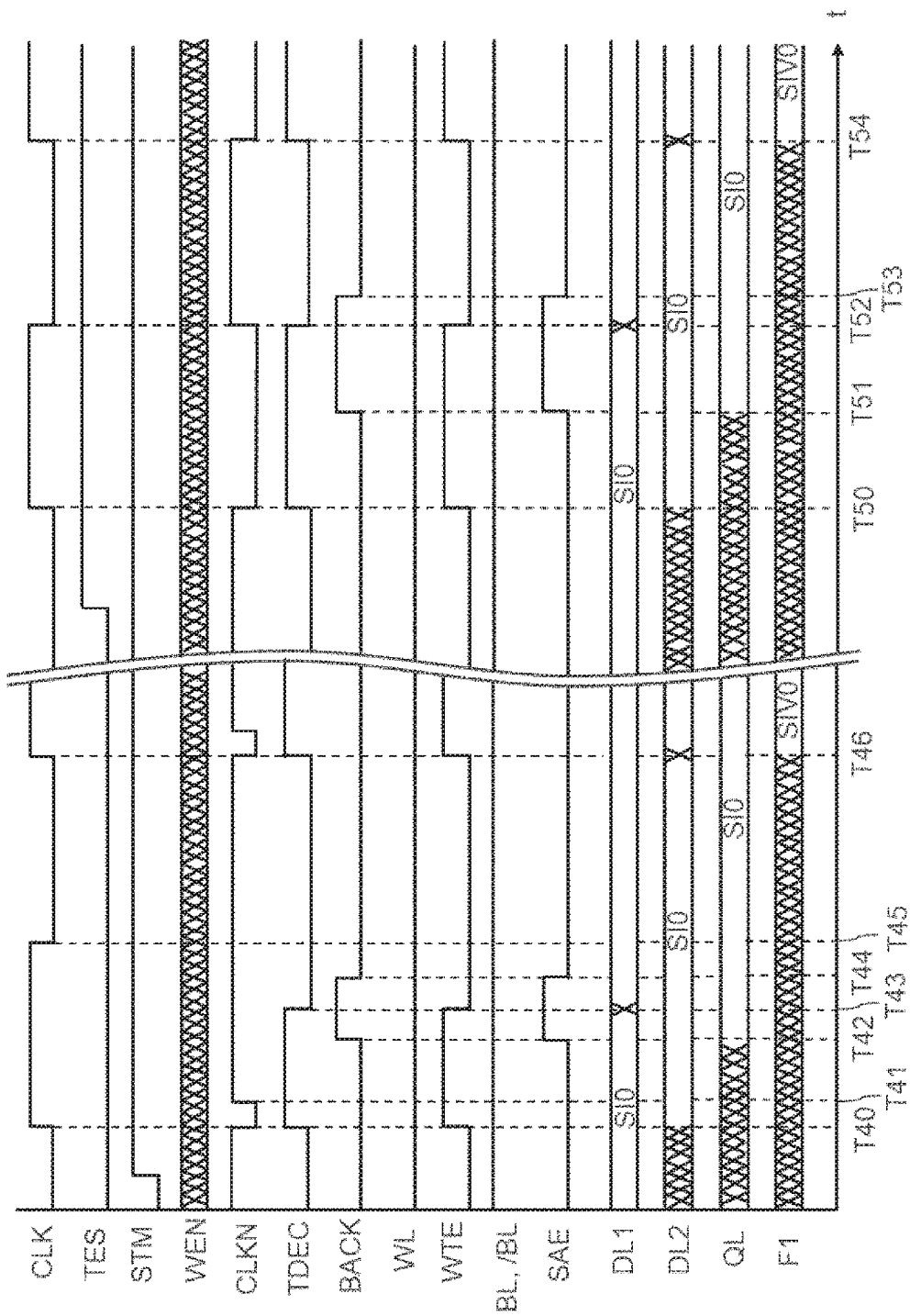
FIG. 9 is a timing chart for explaining a test operation of a semiconductor device including the control circuit according to the second embodiment.

FIG. 9 is a timing chart for explaining a test operation of a semiconductor device including the control circuit according to the second embodiment. In FIG. 9, as with FIG. 5, the input latches DL1 and DL2 and the output latch QL in the input/output circuit IO1, the flip-flop F1, and the test data SI0 and the test data SIV0 are shown.

In the test operation of semiconductor device 1 including the control circuit 8, there are the DC test operation (a first test operation) and the AC test operation (a second test operation). The following DC test and AC test operations are described using the input/output circuit IO1 in the plurality of input/output circuits.

AC Test Operation (Second Embodiment)

The AC test operation of the second embodiment will be described below with reference to FIGS. 1, 3, 8 and 9. A detailed description of the same operation as the above-described the first embodiment or the previous examination example is omitted. In the AC test operation, the bypass mode signal STM is maintained at the "H" level, and the internal control signal WEN is set to the indefinite state. The test mode switching signal TES is maintained at the "L"

level for the AC test. As a result, the bypassing operation of the memory circuit 3 is performed at the time of the AC test operation.

At time T40, the selector SL selects the test data SI0 and outputs the test data SI0 to the input latch DL1, as with the time T20 in the test operation of the first embodiment.

At the time T40, the pulse signal generation circuit PU3 shown in FIG. 8 generates the pulse signal CLKN based on a rising of the external clock signal CLK, the test mode switching signal TES of the "L" level, and the bypass mode signal STM of the "H" level. Since the test mode switching signal TES is at the "L" level, the pulse signal CLKN is maintained at the "L" level during the delay time (during from the time T40 to time T41) by the inverter group IV6. Therefore, the pulse signal CLKN in the AC test operation of the second embodiment is the same as the pulse signal CLKN in the test operation of the previous examination example. Therefore, unlike the pulse signal CLKN in the test operation of the first embodiment, the pulse signal CLKN falls without being based on (without being affected by) a falling of the external clock signal CLK.

Since the configuration of the control circuit 8 other than the pulse signal generation circuit PU3 is the same as that of the control circuit 7, an operation of the control circuit 8 after the time T40 is the same as the test operation of the previous examination example. Specifically, at the time T40, the control circuit 8 activates the start-up signal TDEC and the write control signal WTE as with the time T30 of the previous examination example. At time T42, the control circuit 8 activates the delay signal BACK and the read control signal SAE as with the time T32 of the previous examination example. At time T43, the control circuit 8 deactivates the start-up signal TDEC and the write control signal WTE as with the time T33 of the previous examination example. At time T44, the control circuit 8 deactivates the delay signal BACK and the read control signal SAE as with the time T34 of the previous examination example.

Therefore, the control circuit 8 generates (activates) the control signal CS1 (the start-up signal TDEC, the write control signal WTE, and the read control signal SAE) based on the rising of the external clock signal CLK as with the previous examination example. Accordingly, the test data SI0 is output to the output latch QL via the input latch DL1, the write control circuit WTD, the data line pair BLP, and the read control circuit SA in the input/output circuit IO1 without via the memory array 4.

As with the previous examination example, the control circuit 8 deactivates the control signal CS1 (the start-up signal TDEC and the write control signal WTE) based on the rising of the delay signal BACK signal generated by the rising of the external clock signal CLK and not based on (without being affected by) the falling of the external clock signal CLK at time T45. Similarly, the control circuit 8 deactivates the control signal CS1 (the read control signal SAE) based on the falling of the start-up signal TDEC generated by the rising of the external clock signal CLK. Accordingly, the output latch QL outputs the test data SI0, which is input from the read control circuit SA, to the logic circuit L1.

Accordingly, the logic circuit L1 receives the test data SI0. Thereafter, the test data SI0 is output to the flip-flop F1 as the test data SIV0 via the logic circuit L1.

At time T46, the flip-flop F1 holds the test data SIV0 based on a rising of the external clock signal CLK (a rising following the rising of the external clock signal CLK at the time T40). A subsequent operation is similar to the test operation of the first embodiment.

Further, the control circuit 8 is not limited to the above-described operation and may have a circuit configuration that activates the control signal CS1 based on only the falling of the external clock CKL. In other words, the control circuit 8 activates the control signal CS1 (the start-up signal TDEC, the write control signal WTE, and the read control signal SAE) based on either the rising or the falling of the external clock signal CLK within a single cycle of the external clock signal CLK.

Therefore, in the AC test operation, the control circuit 8 activates the control signal CS1 (the start-up signal TDEC, the write control signal WTE, and the read control signal SAE) for a predetermined period of time by using only the rising of the external clock signal CLK as a trigger.

Therefore, even if the pulse width of the external clock signal CLK is changed, the pulse width of the control signal CS1 (the start-up signal TDEC, the write control signal WTE, and the read control signal SAE) generated by the control circuit 8 is not changed, as with the previous examination example.

As described above, the AC test is the test for checking the transmission timing of the signal and the like. Therefore, in order to checking the transmission timing of the signal of the semiconductor device 1 in the normal operation, the frequency of the external clock signal CLK in the AC test operation is the same as that of the external clock signal CLK in the normal mode operation. Alternatively, in order to improve reliability, the AC test for the semiconductor device 1 is performed using the frequency of the external clock signal CLK higher than the frequency of the external clock signal CLK in the normal operation.

Unlike the control circuit 5 in the test operation of the first embodiment, the control circuit 8 in the AC test operation deactivates the start-up signal TDEC, the delay signal BACK, the write control signal WTE, and the read control signal SAE without being based on (without being affected by) the falling of the external clock signal CLK. Thus, the start-up signal TDEC, the delay signal BACK, the write control signal WTE, and the read control signal SAE are returned to the initial setting values. Therefore, unlike the first embodiment, there are few restrictions on returning these signals to the initial setting values during the "L" level of the external clock signal CLK. Therefore, the frequency of the external clock signal CLK can be increased, and the AC test can be performed in severe environments. As a result, the reliability of the semiconductor device 1 can be enhanced.

DC Test Operation (Second Embodiment)

The DC test operation of the second embodiment will be described below with reference to FIGS. 1, 3, 8 and 9. A detailed description of the same operation as the above-described the first embodiment or the previous examination example is omitted.

In the DC test operation, the bypass mode signal STM is maintained at the "H" level, and the internal control signal WEN is set to the indefinite state. The test mode switching signal TES is maintained at the "H" level for the DC test. As a result, the bypass operation of the memory circuit 3 is performed at the time of the DC test operation.

At time T50, the selector SL selects the test data SI0 and outputs the test data SI0 to the input latch DL1 as with the time T20 in the test operation of the first embodiment.

At the time T50, the pulse signal generation circuit PU3 shown in FIG. 8 generates the pulse signal CLKN based on the rising of the external clock signal CLK, the test mode switching signal TES of the "H" level, and the bypass mode signal STM of the "H" level. Unlike the AC test operation, since the test mode switching signal TES is at the "H" level, the pulse signal CLKN is maintained at the "L" level while the external clock signal CLK is at the "H" level (during from the time T50 to time T52) regardless of the delay by the inverter group IV6. Therefore, the pulse signal CLKN in the DC test operation of the second embodiment is the same as the pulse signal CLKN in the test operation of the first embodiment.

Since the configuration of the control circuit 8 other than the pulse signal generation circuit PU3 is the same as that of the control circuit 5, the operation of the control circuit 8 after the time T50 is the same as that of the test operation of the first embodiment. Specifically, at the time T50, the control circuit 8 activates the start-up signal TDEC and the write control signal WTE at with the time 20 of the first embodiment. At time T51, the control circuit 8 activates the delay signal BACK and the read control signal SAE as with the time T21 of the first embodiment. At time T52, the control circuit 8 deactivates the start-up signal TDEC and the write control signal WTE as with the time T22 of the first embodiment. At time T53, the control circuit 8 deactivates the delay signal BACK and the read control signal SAE as with the time T23 of the first embodiment.

Therefore, the control circuit 8 generates (activates) the start-up signal TDEC, the write control signal WTE and the read control signal SAE, which are the control signal CS1, based on the rising of the external clock signal CLK as with the test operation of the first embodiment. In the DC test operation of the second embodiment, the control signal CS1 is regarded as the start-up signal TDEC, the write control signal WTE and the read control signal SAE. The control circuit 8 deactivates the control signal CS1 based on the falling of the external clock signal CLK. As a result, the test data SI0 is output to the logic circuit L1 via the input latch DL1, the write driving circuit WTD, the bit line pair BLP, the read driving circuit SA and the input latch QL, without via the memory array 4.

Accordingly, the logic circuit L1 receives the test data SI0. Thereafter, the test data SI0 is output to the flip-flop F1 as the test data SIV0 via the logic circuit L1.

At time T54, the flip-flop F1 holds the test data SIV0 based on a rising of the external clock signal CLK (a rising following the rising of the external clock signal CLK at the time T50). A subsequent operation is similar to the test operation of the first embodiment.

Therefore, the control circuit 8 in the DC test operation raises and lowers the control signal CS1 based on the rising and falling of the external clock signal CLK within a single cycle of the external clock signal CLK. That is, as with the control circuit 5 of the first embodiment, the control circuit 8 generates the control signal CS1 synchronized with the pulse width of the external clock signal CLK.

The pulse widths of the control signals CS1 and CS2 generated at the time of the AC test operation differ from the pulse widths of the control signals CS1 and CS2 generated at the time of the DC test operation. For example, as shown in FIG. 9, the pulse width (the range between the time T50 and the time T52) of the control signal CS1 (the start-up signal TDEC) generated at the time of the DC test operation is longer than the pulse width (a range between the time T40 and time T43) of the control signal CS1 (the start-up signal TDEC) generated at the time of the AC test operation. Since, in the test operation, the control circuit 5 receives the test mode switching signal TES of the "H" level (a first level), the control signal CS1 synchronized with the rising and falling of the external clock signal CLK is generated accordingly. On the other hand, since, in the AC test operation, the control circuit 5 receives the test mode switching signal TES of the "L" level (a second level), the control signal CS1 synchronized with the rising of the external clock signal CLK and not synchronized with the falling of the external clock signal CLK is generated.

Therefore, the control circuit 8 in the DC test operation can lengthen the activation period of the write control circuit WTD, the activation period of the read control circuit SA, the data holding period of the input latch DL1, the data receiving period of the input latch DL2, and the data receiving period of the output latch QL in the input/output circuit IO1 by lengthening the pulse width of the external clock signal CLK. That is, as with the control circuit 5 of the first embodiment, the DC test can be performed on many logic circuits. In addition, highly reliable DC test can be performed. As compared with the first embodiment, in the second embodiment, the operation of input/output circuit IO1 can be changed for the AC test or the DC test by the test mode switching signal TES. Thereby, an efficiency of the test as a whole can be improved. As a result, the testing time is shortened, and the manufacturing costs of the semiconductor device can be reduced.

The operation of the control circuit 8 at the time of the DC test operation described above is premised on the case where the fall timing (the time T53) of the external clock signal CLK is later than the rise timing (the time T51) of the delay signal BACK, as in the test operation of the first embodiment. When the fall timing of the external clock signal CLK is earlier than the rise timing of the delay signal BACK, it is the same as the operation of control circuit 5 of the first embodiment in this condition.

What is claimed is:

1. A semiconductor device comprising:
   a memory circuit; and
   a logic circuit coupled with the memory circuit,
   wherein the memory circuit includes:
      a memory array including a plurality of memory cells arranged in a matrix;
      an input/output circuit for writing data to the plurality of memory cells and reading data from the plurality of memory cells; and
      a control circuit for generating a control signal for controlling the input/output circuit,
   wherein in a first test operation for testing the logic circuit, the control circuit receives an external clock signal, raises the control signal based on a rising of the external clock signal and lowers the control signal based on a falling of the external clock signal,
   wherein in the first test operation, the input/output circuit receives a test data, and
   wherein in the first test operation, the input/output circuit outputs to the test data to the logic circuit based on the rising and falling of the control circuit.

2. The semiconductor device according to claim 1,
   wherein in a writing operation for writing data to the plurality of memory cells, the control circuit raises the control signal based on either the rising or falling of the external clock signal,
   wherein in the writing operation, the input/output circuit receives data, and
   wherein in the writing operation, the input/output circuit writes the data to the plurality of memory cells based on the rising of the control signal.

3. The semiconductor device according to claim 2,
wherein the control circuit and the input/output circuit further receive a bypass mode signal,
wherein in the first test operation, the control circuit raises the control signal based on the rising of the external clock signal and the bypass mode signal of a first level, and lowers the control signal based on the falling of the external clock signal and the bypass mode signal of the first level,
wherein in the first test operation, the input/output circuit receives the test data based on the bypass mode signal of the first level, and
wherein in the first test operation, the input/output circuit outputs the test data to the logic circuit without via the memory array.

4. The semiconductor device according to claim 3,
wherein in the writing operation, the control circuit raises the control signal based on the bypass mode signal of a second level and either the rising or falling of the external clock signal, and
wherein in the writing operation, the input/output circuit receives the data based on the bypass mode signal of the second level.

5. The semiconductor device according to claim 4,
wherein the first level is a power supply voltage level, and
wherein the second level is a ground voltage level.

6. The semiconductor device according to claim 2, further comprising:
a flip-flop coupled with the memory circuit via the logic circuit; and
an external clock generation circuit for generating the external clock signal and supplying the external clock signal to the control circuit and the flip-flop.

7. The semiconductor device according to claim 6,
wherein the logic circuit be comprised of a P-channel MOS transistor and an N-channel MOS transistor.

8. The semiconductor device according to claim 7,
wherein the input/output circuit includes:
a write driving circuit for writing data to the plurality of memory cell;
a read driving circuit for reading data held by the plurality of memory cells; and
a data line pair coupled with the write driving circuit and the read driving circuit,
wherein in the first test operation, the input/output circuit transfers the test data from the write driving circuit to the read driving circuit via the data line pair based on the rising of the control signal.

9. The semiconductor device according to claim 8,
wherein in the writing operation, the input/output circuit writes the data from the write driving circuit to the plurality of memory cells via the data line pair based on the rising of the control signal.

10. The semiconductor device according to claim 1,
wherein in a second test operation for testing the logic circuit, the control circuit raises the control signal based on either the rising or falling of the external clock signal,
wherein in the second test operation, the input/output circuit receives a test data, and
wherein in the second test operation, the input/output circuit outputs the test data to the logic circuit based on the rising of the control circuit, not based on a falling of the control circuit.

11. The semiconductor device according to claim 10,
wherein the first test is a DC test for checking a static characteristic of the logic circuit, and
wherein the second test is an AC test for checking a dynamic characteristic of the logic circuit.

12. The semiconductor device according to claim 11,
wherein the control circuit further receives a test mode switching signal,
wherein in the first test operation, the control circuit raises the control signal based on the rising of the external clock signal and the test mode switching signal of a first level, and lowers the control signal based on the falling of the external clock signal and the test mode switching signal of the first level, and
wherein in the second test operation, the control circuit raises the control signal based on either the rising or falling of the external clock signal and the test mode switching signal of a second level.

13. The semiconductor device according to claim 12,
wherein the first level is a power supply voltage level, and
wherein the second level is a ground voltage level.

14. The semiconductor device according to claim 1,
wherein the rising and falling of the external clock signal occur within a single cycle of the external clock signal.

15. A semiconductor device comprising:
a memory circuit including a memory array including a plurality of memory cells arranged in a matrix, a plurality of input/output circuits for writing data to the plurality of memory cells and reading data from the plurality of memory cells, and a control circuit for generating a control signal for controlling the plurality of input/output circuits; and
a plurality of logic circuits coupled with the plurality of input/output circuits,
wherein in a test operation for testing the plurality of logic circuits, the control circuit receives an external clock signal and generates the control signal synchronized with a pulse width of the external clock signal,
wherein in the test operation, each of the plurality of input/output circuits receives a test data, and outputs the test data to each of the plurality of logic circuits based on the control signal.

16. The semiconductor device according to claim 15,
wherein the memory array includes a plurality of bit line pairs provided corresponding to columns of the plurality of memory cells, and
wherein each of the plurality of input/output circuits is coupled with each of the plurality of bit line pairs.

17. The semiconductor device according to claim 16,
wherein each of the plurality of input/output circuits receives a bypass mode signal,
wherein in the test operation, each of the plurality of input/output circuits is serially coupled in accordance with the bypass mode signal to form a scan chain which is a transmission path of the test data.

18. The semiconductor device according to claim 17,
wherein the test operation is for performing a DC test for checking a static characteristic of the plurality of logic circuits.

19. A semiconductor device comprising:
a memory circuit; and
a logic circuit coupled with the memory circuit,
wherein the memory circuit includes:
a memory array including a plurality of memory cells arranged in a matrix;

an input/output circuit for writing data to the plurality of memory cells and reading data from the plurality of memory cells; and a control circuit for generating a control signal for controlling the input/output circuit, wherein in a test operation for testing the logic circuit, the control circuit receives an external clock signal and generates a control signal synchronized with a pulse width of the external clock signal, wherein in the first test operation, the input/output circuit receives a test data and outputs the test data to the logic circuit based on the control circuit.

20. The semiconductor device according to claim 19, wherein in a writing operation for writing data to the plurality of memory cells, the control circuit raises the control signal based on either a rising or falling of the external clock signal, and wherein in the writing operation, the input/output circuit receives data and writes the data to the plurality of memory cells based on the rising of the control signal.

* * * * *